United States Patent [19]
Takamine et al.

[11] Patent Number: 6,130,901
[45] Date of Patent: Oct. 10, 2000

[54] SHG LASER STABILIZING CONTROL DEVICE AND OPTICAL DISK RECORDING/REPRODUCTION DEVICE

[75] Inventors: Kouichi Takamine, Kawanishi; Hiroyuki Yamaguchi, Nishinomiya; Yasuo Kitaoka, Ibaraki, all of Japan

[73] Assignee: Matsushita Electric Industrial Co., Ltd., Osaka, Japan

[21] Appl. No.: 09/073,888

[22] Filed: May 6, 1998

[30] Foreign Application Priority Data

May 7, 1997 [JP] Japan ..................... 9-116630

[51] Int. Cl.$^7$ ..................... H01S 3/10; H01S 3/13; H01S 3/00; H01S 5/00
[52] U.S. Cl. ............... 372/32; 372/22; 372/38; 372/46
[58] Field of Search ............... 372/22, 46, 32, 372/38

[56] References Cited

U.S. PATENT DOCUMENTS

| 5,428,700 | 6/1995 | Hall | 372/32 |
| 5,663,980 | 9/1997 | Adachi | 372/108 |

FOREIGN PATENT DOCUMENTS 4-280233  10/1992  Japan.
9-189929  7/1997  Japan.

OTHER PUBLICATIONS

Kazuhisa Yamamoto et al., "Milliwatt–Order blue–light generation in a periodically domain–inverted. LiTaO$_3$ waveguide", Aug. 1, 1991, Optics Letters, vol. 16, No. 15 (pp. 1156–1158).

Primary Examiner—Frank G. Font
Assistant Examiner—Armando Rodriguez
Attorney, Agent, or Firm—Ratner & Prestia

[57] ABSTRACT

The SHG laser stabilizing control device of this invention has: an SHG laser having a semiconductor laser having a wavelength which changes in a step-wise manner in response to a change in a wavelength-changeable current and a wavelength conversion element which converts the wavelength of output light of the semiconductor laser into a shorter wavelength; an optical detection section for detecting a step-wise change in the wavelength of output light of the SHG laser; a current changing section which changes the wavelength-changeable current supplied to the semiconductor laser in order to change the wavelength of the semiconductor laser; and a wavelength-changeable current control section which obtains a gap current value of the wavelength-changeable current at which the step-wise change in the wavelength is detected by the optical detection section and adds or subtracts a predetermined current value to or from the gap current value to set a wavelength-changeable current value.

25 Claims, 19 Drawing Sheets

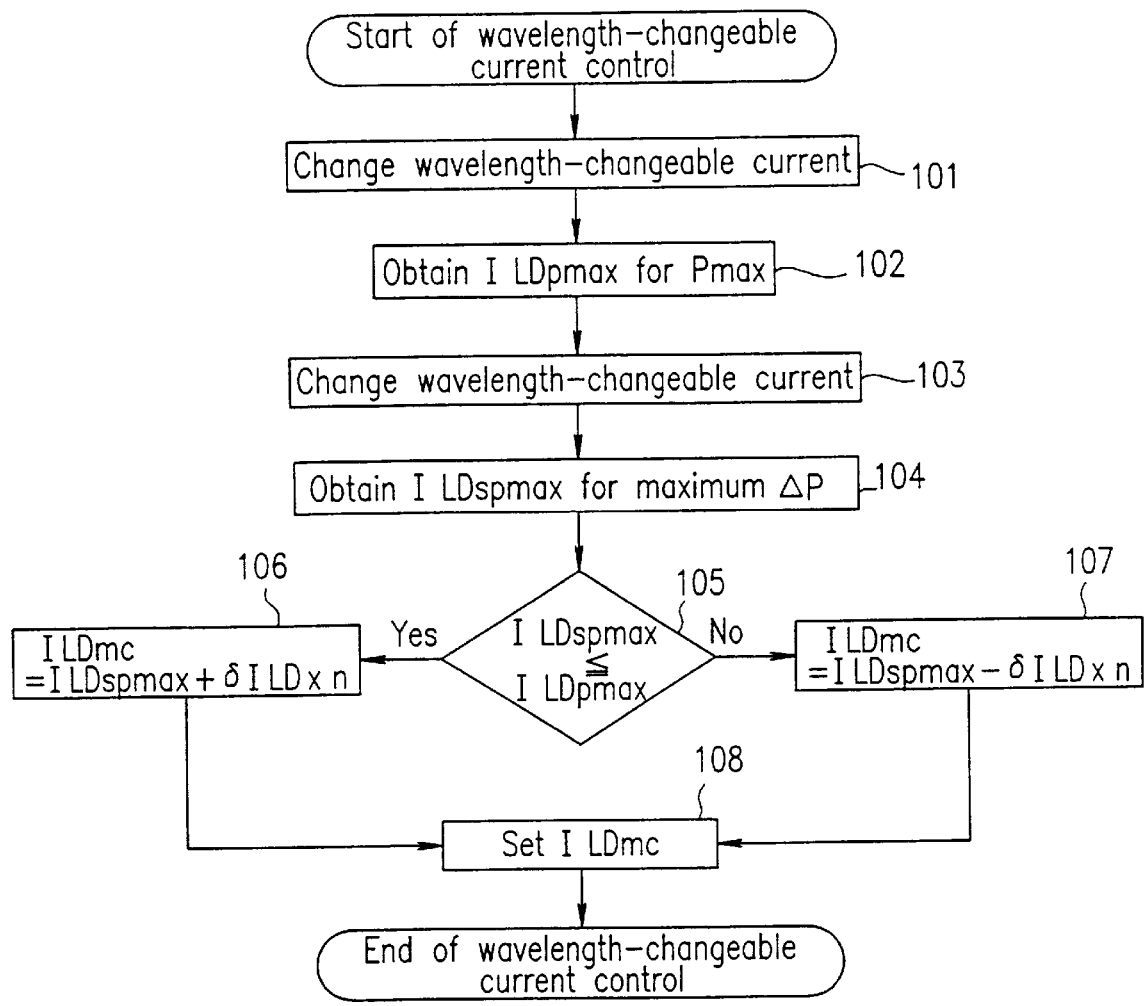

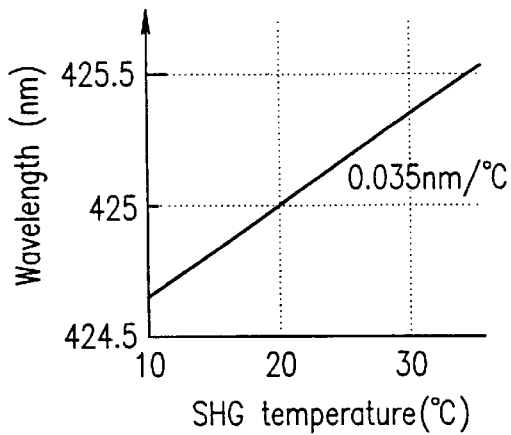
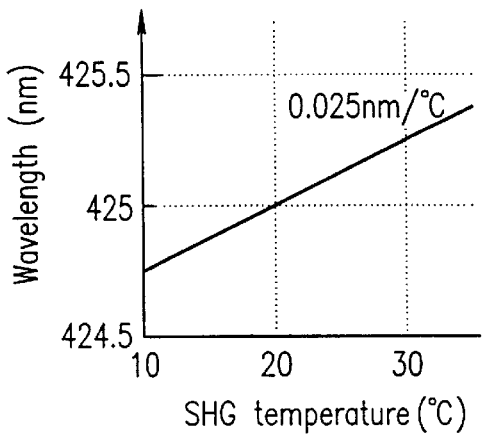
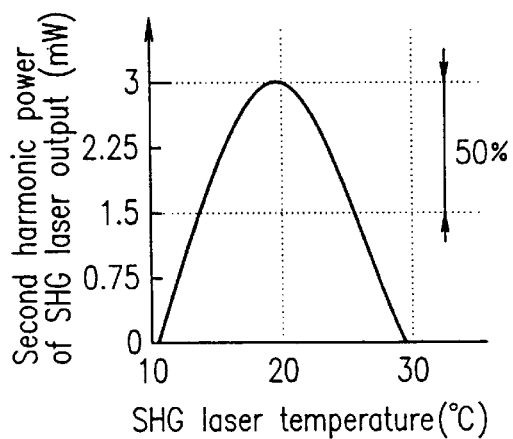
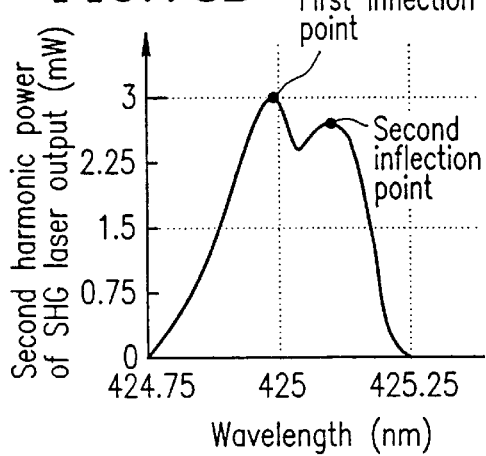
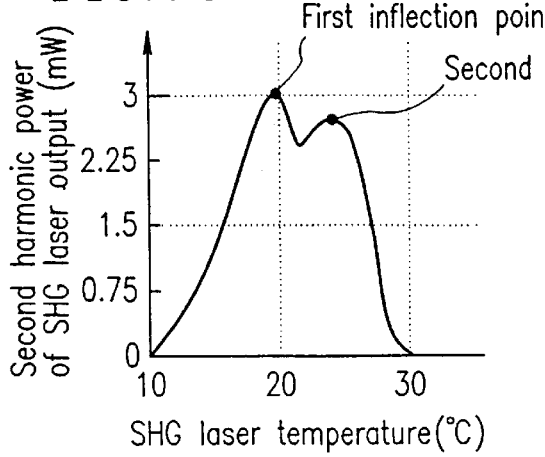

SHG LASER STABILIZING CONTROL DEVICE AND OPTICAL DISK RECORDING/ REPRODUCTION DEVICE

BACKGROUND OF THE INVENTION

1. Field of the Invention

The present invention relates to a second harmonic generation (SHG) laser stabilizing control device for stabilizing the intensity of output light of an SHG laser.

2. Description of the Related Art

As is well known, in order to increase the recording capacity of an optical disk, a short-wavelength coherent light source is required. More specifically, as the surface recording density of a disk improves, the size of a condensed light spot on the disk needs to be reduced. From the simple principle that the size of a condensed light spot is proportional to the wavelength of the light, a light source which generates short-wavelength light is essentially demanded. Thus, a small and practical short-wavelength light source is desired.

One conventional technique for realizing short-wavelength light is second harmonic generation (SHG) using a near-infrared semiconductor laser and a quasi phase match (QPM) type polarization inversion waveguide device (Yamamoto, et al., "Optics Letters" Vol. 16, No. 15, 1156 (1991)).

FIG. 20 is a schematic structural view of a conventional blue light source using a polarization inversion waveguide device. Referring to FIG. 20, the blue light source includes a 0.85 µm-band 100 mw-class AlGaAs distributed Bragg reflection (DBR) semiconductor laser 1019, a collimator lens 1020 with a numerical aperture (NA) of 0.5, a half-wave (λ/2) plate 1021, a focusing lens 1022 with an NA of 0.5, and a polarization inversion waveguide device 1023 composed of a wavelength conversion device.

The DBR semiconductor laser 1019 includes a DBR region for controlling the oscillation wavelength. The DBR region incorporates an internal heater for changing the oscillation wavelength.

The polarization inversion waveguide device 1023 includes an $LiTaO_3$ substrate 1024 and an optical waveguide 1025 and periodical polarization inversion regions 1026 formed on the substrate 1024.

Laser light which has been collimated by the collimator lens 1020 is incident on the λ/2 plate 1021, where the polarization direction of the laser light is rotated. The resultant laser light is then focused by the focusing lens 1022 on an end face of the optical waveguide 1025 of the polarization inversion waveguide device 1023. The laser light then propagates through the optical waveguide 1025 as well as the polarization inversion regions 1026. During the propagation, part of the laser light is converted into harmonic, which is output from the output end face of the optical waveguide 1025, together with the fundamental wave of the laser light which has been remained unchanged.

The phase match wavelength allowance of the polarization inversion waveguide device 1023 is set as small as about 0.1 nm to increase the efficiency of wavelength conversion. In order to meet this setting, the oscillation wavelength is set within the phase match wavelength allowance of the polarization inversion waveguide device 1023 and fixed by controlling a current applied to a DBR region of the DBR semiconductor laser 1019. With this configuration, when laser light with an intensity of 70 mW is incident on the optical waveguide 1025, about 3 mW of blue light with a wavelength of 425 nm is obtained.

The DBR semiconductor laser 1019 is essentially composed of an active region for providing a gain and the DBR region for controlling the oscillation wavelength. The active region has a diffraction lattice which makes the DBR region transmittable for the wavelength of 850 nm of the laser light. With this arrangement, the oscillation wavelength is controlled by the wavelength of the light reflected by the DBR region. The oscillation wavelength may also be changed by changing the refraction index of the DBR region. The refraction index of the DBR region may be changed by a method where a wavelength-changeable current applied to the DBR region is changed, a method where the temperature is changed using an electronic cooling element (e.g., a Peltier element), or the like.

FIG. 3 shows the relationship between the wavelength-changeable current applied to the DBR region and the oscillation wavelength of the DBR semiconductor laser. As is apparent from FIG. 3, the oscillation wavelength shifts toward a longer wavelength as the wavelength-changeable current increases by repeated mode hopping. The oscillation wavelength obtained at a certain current point when the wavelength-changeable current is gradually being increased is different from the oscillation wavelength obtained at the same current point when the wavelength-changeable current is gradually being decreased. That is, hysteresis is exhibited. Accordingly, when the oscillation wavelength is changed by changing the wavelength-changeable current, a measure against the hysteresis is required, where a wavelength-changeable current which is smaller or larger by a predetermined amount than a target wavelength-changeable current with which a desired wavelength is obtained is first set, and then the set wavelength-changeable current is gradually increased or decreased to the target wavelength-changeable current with which the desired wavelength is obtained.

The conventional SHG laser using the above-described DBR semiconductor laser as a fundamental wave light source has the following problems.

When the oscillation wavelength is changed by changing the wavelength-changeable current, a wavelength-changeable current with which the second harmonic power of output light of the SHG laser is near maximum needs to be determined as the current to be supplied to the DBR semiconductor laser.

As described above, however, the oscillation wavelength of the DBR semiconductor laser shifts by repeated mode hopping with respect to the wavelength-changeable current. Accordingly, when the wavelength-changeable current is fixed so that the second harmonic power of output light of the SHG laser is maximum, if the fixed wavelength-changeable current is near a current amount at which the mode hopping occurs, the resultant second harmonic power of the SHG output becomes unstable.

The second problem is as follows. After the wavelength-changeable current is set at a stable point, the temperature of the SHG laser is varied by a Peltier element or the like, to search for a temperature at which the second harmonic power of output light of the SHG laser is maximum. This search includes searching for an inflection point (maximal value) of the second harmonic power while changing the temperature by a predetermined step and determining a temperature corresponding to the inflection point.

However, a plurality of inflection points may be found in the second harmonic power of output light of the SHG laser when the temperature is changed. This occurs due to a variation in the characteristics of the polarization inversion waveguide device, such as a non-uniform width of the waveguide. If a plurality of inflection points exist, it is difficult to precisely recognize the maximum second harmonic power and thus to determine the temperature of the SHG laser corresponding to the maximum second harmonic power.

The method for changing the temperature of the SHG laser includes a method where temperature servo control is performed to make the temperature of the SHG laser constant, so that the temperature of the SHG laser is set at a target temperature, for example.

However, a control error and a temperature offset value due to circuit offset exist between the temperature target value and the actual detected temperature. Accordingly, even if the temperature of the SHG laser is adjusted to the temperature target value, the actual temperature of the SHG laser does not necessarily agree with the target temperature, or it takes time to approximate the actual temperature to the target temperature.

The third problem is as follows. When the wavelength-changeable current is controlled so that the second harmonic power of output light of the SHG laser is stabilized at around the maximum thereof, the output characteristics of the semiconductor laser need to be kept constant without change.

However, when the current applied to the active region of the semiconductor laser is controlled by constant voltage driving, a temperature change at the DBR region may affect the active region. This occurs because the wavelength-changeable current is changed so swiftly or the DBR region and the active region are so close to each other that the temperature of the DBR region of the semiconductor laser becomes uncontrolled although the SHG laser is under temperature control of keeping the temperature thereof constant. As a result, the output characteristics of the semiconductor laser vary.

When the temperature of the SHG laser is changed so as to search for a temperature at which the second harmonic power of output light of the SHG laser is maximum, also, temperature change occurs in the DBR region because the current applied to the active region is controlled by constant voltage driving as described above. This also results in a variation in the output characteristics of the semiconductor laser.

SUMMARY OF THE INVENTION

In view of the above, the first object of the present invention is to provide an SHG laser stabilizing control device which can stabilize the second harmonic power of an SHG output by automatically setting the wavelength-changeable current in the range where the oscillation wavelength of a DBR semiconductor laser does not mode-hop.

The second object of the present invention is to provide an SHG laser stabilizing control device which can precisely recognize the maximum second harmonic power even when a plurality of maximal values exist in the second harmonic power of output light of the SHG laser, to allow to determine the temperature of the SHG laser corresponding to the maximum second harmonic power.

The third object of the present invention is to provide an SHG laser stabilizing control device which can precisely and swiftly control the temperature of the SHG laser.

The fourth object of the present invention is to provide an SHG stabilizing control device which can keep the output characteristics of the semiconductor laser constant while controlling the current applied to an active region of the semiconductor laser by constant voltage driving.

The fifth object of the present invention is to provide an optical disk recording/reproduction device using such an SHG laser stabilizing control device.

The SHG laser stabilizing control device of this invention includes: an SHG laser including a semiconductor laser having a wavelength which changes in a step-wise manner in response to a change in a wavelength-changeable current and a wavelength conversion element which converts the wavelength of output light of the semiconductor laser into a shorter wavelength; an optical detection section for detecting a step-wise change in the wavelength of output light of the SHG laser; a current changing section which changes the wavelength-changeable current supplied to the semiconductor laser in order to change the wavelength of the semiconductor laser; and a wavelength-changeable current control section which obtains a gap current value of the wavelength-changeable current at which the step-wise change in the wavelength is detected by the optical detection section and adds or subtracts a predetermined current value to or from the gap current value to set a wavelength-changeable current value.

In one embodiment of the invention, the optical detection section detects an intensity of the output light of the SHG laser.

In another embodiment of the invention, the wavelength-changeable current control section gradually increases or decreases the wavelength-changeable current by controlling the current changing section, to obtain a gap current value of the wavelength-changeable current at which the step-wise change in the output of the optical detection section is maximum, and adds or subtracts a predetermined current value to or from the gap current value to set the wavelength-changeable current value.

In still another embodiment of the invention, the wavelength-changeable current control section gradually increases or decreases the wavelength-changeable current by controlling the current changing section, to obtain a first gap current value and a second gap current value which is next adjacent to the first gap current value of the wavelength-changeable current at which the detected SHG laser output has changed in a step-wise manner, and obtains a predetermined current value to be added to or subtracted from the gap current values based on a difference current between the first and second current values.

In still another embodiment of the invention, the wavelength-changeable current control section gradually increases or decreases the wavelength-changeable current by controlling the current changing section, to obtain a first gap current value and a second gap current value which is next adjacent to the first gap current value of the wavelength-changeable current at which the detected intensity of the output light of the SHG laser has changed in a step-wise manner, and obtains 20% to 80% of a difference current between the first and second current values as a predetermined current value to be added to or subtracted from the gap current values.

In still another embodiment of the invention, the wavelength-changeable current control section changes the wavelength-changeable current by controlling the current changing section, to obtain a wavelength-changeable current $I_{LDpmax}$ at which the output of the optical detection section is maximum, and gradually increases the wavelength-changeable current to obtain a gap current value $I_{LDspmax}$ corresponding to a wavelength-changeable current at which the step-wise change in the output of the optical detection section is maximum, to add a predetermined current value to the gap current value $I_{LDspmax}$ if the gap current value $I_{LDspmax}$ is equal to or less than the maximum wavelength-changeable current $I_{LDpmax}$, or subtract the predetermined current value from the gap current value $I_{LDspmax}$ if the gap current value $I_{LDspmax}$ exceeds the maximum wavelength-changeable current $I_{LDpmax}$.

In still another embodiment of the invention, the wavelength-changeable current control section changes the wavelength-changeable current by controlling the current changing section, to obtain a wavelength-changeable current $I_{LDpmax}$ at which the output of the optical detection section is maximum, and gradually decreases the wavelength-changeable current to obtain a gap current value $I_{LDspmax}$ corresponding to a wavelength-changeable current at which the step-wise change in the output of the optical detection section is maximum, to subtract a predetermined current value from the gap current value $I_{LDspmax}$ if the gap current value $I_{LDspmax}$ is equal to or less than the maximum wavelength-changeable current $I_{LDpmax}$, or add the predetermined current value to the gap current value $I_{LDspmax}$ if the gap current value $I_{LDspmax}$ exceeds the maximum wavelength-changeable current $I_{LDpmax}$.

In still another embodiment of the invention, the wavelength-changeable current control section gradually increases or decreases the wavelength-changeable current by controlling the current changing section, to obtain a gap current value $I_{LDspmax}$ of the wavelength-changeable current at which the step-wise change in the output of the optical detection section is maximum, and further gradually increases or decreases the wavelength-changeable current to obtain a gap current value of the wavelength-changeable current at which the output of the optical detection section has changed in a step-wise manner, to obtain a difference current between these gap current values and add or subtract a predetermined current value which is smaller than the difference current to or from the gap current value $I_{LDspmax}$ thereby to set a wavelength-changeable current value.

In still another embodiment of the invention, the wavelength-changeable current control section gradually increases or decreases the wavelength-changeable current by controlling the current changing section, to obtain a gap current value $I_{LDspmax}$ of the wavelength-changeable current at which the step-wise change in the output of the optical detection section is maximum, and further gradually increases or decreases the wavelength-changeable current to obtain a gap current value of the wavelength-changeable current at which the output of the optical detection section has changed in a step-wise manner, so as to obtain a difference current between these gap current values and add or subtract a predetermined current value which is 20% to 80% of the difference current to or from the gap current value $I_{LDspmax}$ thereby to set a wavelength-changeable current value.

In still another embodiment of the invention, the SHG laser has a configuration where the semiconductor laser and the wavelength conversion element are integrally formed on a same base material.

In still another embodiment of the invention, the SHG laser stabilizing control device further includes: a temperature changing section for changing a temperature of the SHG laser; a temperature detection section for detecting the temperature of the SHG laser; and a temperature control section for controlling the temperature changing section based on an output of the temperature detection section so that the temperature of the SHG laser is a predetermined temperature.

In still another embodiment of the invention, the wavelength-changeable current which changes the wavelength of the semiconductor laser is controlled under a state where a power-changeable current which changes the intensity of the output light of the semiconductor laser is controlled to be constant.

In still another embodiment of the invention, the SHG laser stabilizing control device further includes an infrared-cut filter for cutting infrared light of the output light of the SHG laser, wherein the output light of the SHG laser is detected via the infrared-cut filter.

Alternatively, the SHG laser stabilizing control device of this invention includes: an SHG laser including a semiconductor laser having a wavelength which changes in a step-wise manner in response to a change in a wavelength-changeable current and a wavelength conversion element which converts the wavelength of output light of the semiconductor laser into a shorter wavelength; an optical detection section for detecting an intensity of output light of the SHG laser; a current changing section which changes the wavelength-changeable current supplied to the semiconductor laser in order to change the wavelength of the semiconductor laser; and a wavelength-changeable current control section which changes the wavelength-changeable current by controlling the current changing section to obtain a maximum output of the optical detection section, gradually increases the wavelength-changeable current to obtain an output $P_{th1}$ of the optical detection section at which the output has exceeded a first threshold value which is smaller than the maximum output by a predetermined value, and gradually increases the wavelength-changeable current to obtain a wavelength-changeable current at which the output of the optical detection section has exceeded a second threshold value which is smaller than $P_{th1}$ by a predetermined value, to add a predetermined current value to the obtained wavelength-changeable current to set a wavelength-changeable current value.

In one embodiment of the invention, the first threshold value is set at a value equal to or less than a maximum value in a range of the output of the optical detection section where the output continuously changes with the change of the wavelength-changeable current ranging from a wavelength-changeable current at which a step-wise change in the output of the optical detection section which is closest to the maximum output has occurred on the side below the wavelength-changeable current corresponding to the maximum output of the optical detection section to the wavelength-changeable current corresponding to the maximum output.

In another embodiment of the invention, the second threshold value is set between a larger value and a smaller value of an output of the optical detection section at a point of the step-wise change in the output of the optical detection section which is closest to the maximum output on the side below the wavelength-changeable current corresponding to the maximum output of the optical detection section.

Alternatively, the SHG laser stabilizing control device of this invention includes: an SHG laser including a semiconductor laser having a wavelength which changes in a step-wise manner in response to a change in a wavelength-changeable current and a wavelength conversion element which converts the wavelength of output light of the semiconductor laser into a shorter wavelength; an optical detection section for detecting an intensity of output light of the SHG laser; a current changing section which changes the wavelength-changeable current supplied to the semiconductor laser in order to change the wavelength of the semiconductor laser; and a wavelength-changeable current control section which changes the wavelength-changeable current by controlling the current changing section to obtain a maximum output of the optical detection section, gradually decreases the wavelength-changeable current to obtain an output $P_{th1}$ of the optical detection section at which the output has exceeded a first threshold value which is smaller than the maximum output by a predetermined value, and gradually decreases the wavelength-changeable current to obtain a wavelength-changeable current at which the output of the optical detection section has exceeded a second threshold value which is smaller than $P_{th1}$ by a predetermined value, to subtract a predetermined current value from the obtained wavelength-changeable current to set a wavelength-changeable current value.

In one embodiment of the invention, the first threshold value is set at a value equal to or less than a maximum value in a range of the output of the optical detection section where the output continuously changes with the change of the wavelength-changeable current ranging from a wavelength-changeable current at which a step-wise change in the output of the optical detection section which is closest to the maximum output has occurred to the wavelength-changeable current corresponding to the maximum output.

In another embodiment of the invention, the second threshold value is set between a larger value and a smaller value of an output of the optical detection section at a point of the step-wise change of the output of the optical detection section which is closest to the maximum output on the side above the wavelength-changeable current corresponding to the maximum output of the optical detection section.

Alternatively, the SHG laser stabilizing control device of this invention includes: an SHG laser including a semiconductor laser having a wavelength which changes in a step-wise manner in response to a change in a wavelength-changeable current and a wavelength conversion element which converts the wavelength of output light of the semiconductor laser into a shorter wavelength; an optical detection section for detecting an intensity of output light of the SHG laser; a current changing section which changes the wavelength-changeable current supplied to the semiconductor laser in order to change the wavelength of the semiconductor laser; a wavelength-changeable current control section which changes the wavelength-changeable current by the current changing section to obtain a gap current value of the wavelength-changeable current at which an output of the optical detection section changes in a step-wise manner, and adds or subtracts a predetermined current value to or from the gap current value to set a wavelength-changeable current value; a temperature changing section for changing a temperature of the SHG laser; a temperature detection section for detecting the temperature of the SHG laser; and a temperature control section for controlling the temperature changing section based on an output of the temperature detection section so that the temperature of the SHG laser is a predetermined temperature, and in this state, controlling the temperature changing section so that the output of the optical detection section is a predetermined value after the wavelength-changeable current is set at the predetermined current value.

In one embodiment of the invention, the temperature control section controls the temperature changing section based on the output of the temperature detection section so that the temperature of the SHG laser is a predetermined temperature, and, in this state, operates by changing the temperature of the SHG laser in a predetermined range by the temperature changing section after the wavelength-changeable current is set at the predetermined current value to obtain a temperature at which the output of the optical detection section is a predetermined value, and then changing the temperature again along a predetermined change width having the obtained temperature at the center so that the output of the optical detection section has a predetermined value.

In another embodiment of the invention, the temperature control section controls the temperature changing section based on the output of the temperature detection section so that the temperature of the SHG laser is a predetermined temperature, and, in this state, operates by changing the temperature of the SHG laser toward a temperature lower than a target lower-limit temperature by the temperature changing section after the wavelength-changeable current is set at a predetermined current value by the wavelength-changeable current control section, and, after the temperature of the SHG laser reaches the lower-limit temperature, changing the temperature of the SHG laser toward a temperature higher than a target upper-limit temperature to obtain a temperature at which the output of the optical detection section is a predetermined value while the temperature of the SHG laser is changing from the lower-limit temperature to the upper-limit temperature, and then changing the temperature of the SHG laser again along a predetermined change width having the obtained temperature at the center so that the output of the optical detection section has a predetermined value.

Alternatively, the SHG laser stabilizing control device of this invention includes: an SHG laser including a semiconductor laser having a wavelength which changes in a step-wise manner in response to a wavelength-changeable current and an intensity of output light changes in response to a power-changeable current, and a wavelength conversion element which converts the wavelength of output light of the semiconductor laser into a shorter wavelength; a first optical detection section for detecting a harmonic light beam of output light of the SHG laser; a second optical detection section for detecting a fundamental wave light beam of the output light of the SHG laser; a current changing section which changes the wavelength-changeable current supplied to the semiconductor laser in order to change the wavelength of the semiconductor laser; a wavelength-changeable current control section which changes the wavelength-changeable current by the current changing section to obtain a gap current value of the wavelength-changeable current at which an output of the first optical detection section changes in a step-wise manner, and adds or subtracts a predetermined current value to or from the gap current value to set a wavelength-changeable current value; a power-changeable current control section which controls a power-changeable current so that an output of the second optical detection section is made constant at the wavelength-changeable current control, and controls the power-changeable current so that an output of the first optical detection section is made constant after the wavelength-changeable current control.

Alternatively, the SHG laser stabilizing control device of this invention includes: an SHG laser including a semiconductor laser having a wavelength which changes in a step-wise manner in response to a wavelength-changeable current and an intensity of output light changes in response to a power-changeable current, and a wavelength conversion element which converts the wavelength of output light of the semiconductor laser into a shorter wavelength; a first optical detection section for detecting a harmonic light beam of the output light of the SHG laser; a second optical detection section for detecting a fundamental wave light beam of the output light of the SHG laser; a current changing section which changes the wavelength-changeable current supplied to the semiconductor laser in order to change the wavelength of the semiconductor laser; a wavelength-changeable current control section which changes the wavelength-changeable current by the current changing section to obtain a gap current value of the wavelength-changeable current at which an output of the first optical detection section changes in a step-wise manner, and adds or subtracts a predetermined current value to or from the gap current value to set a wavelength-changeable current value; a temperature changing section for changing a temperature of the SHG laser; a temperature detection section for detecting the temperature of the SHG laser; a temperature control section for controlling the temperature changing section based on an output of the temperature detection section so that the temperature of the SHG laser is a predetermined temperature, and, in this state, controlling the temperature changing section so that the output of the optical detection is a predetermined value after the wavelength-changeable current is set at the predetermined current value; and a power-changeable current control section which controls the power-changeable current so that an output of the second optical detection section is made constant when the wavelength-changeable current control and the change of the temperature of the SHG laser change are being performed, and controls the power-changeable current so that an output of the first optical detection section is made constant when the wavelength-changeable current control and the change of the temperature of the SHG laser are not being performed.

According to another aspect of the invention, an optical disk recording/reproduction device is provided. The device includes: an SHG laser stabilizing control device described above; and an optical system for condensing output light of the SHG laser of the SHG laser stabilizing control device on an optical disk.

Thus, the invention described herein makes possible the advantages of (1) providing an SHG laser stabilizing control device which can stabilize the second harmonic power of an SHG output by automatically setting the wavelength-changeable current in the range where the oscillation wavelength of a DBR semiconductor laser does not mode-hop, (2) providing an SHG laser stabilizing control device which can precisely recognize the maximum second harmonic power even when a plurality of maximal values exist in the second harmonic power of output light of the SHG laser, to allow determination of the temperature of the SHG laser corresponding to the maximum second harmonic power, (3) providing an SHG laser stabilizing control device which can precisely and swiftly control the temperature of the SHG laser, (4) providing an SHG stabilizing control device which can keep the output characteristics of the semiconductor laser constant while controlling the current applied to an active region of the semiconductor laser by constant voltage driving, and (5) providing an optical disk recording/reproduction device using such an SHG laser stabilizing control device.

These and other advantages of the present invention will become apparent to those skilled in the art upon reading and understanding the following detailed description with reference to the accompanying figures.

BRIEF DESCRIPTION OF THE DRAWINGS

FIG. 6 is a flowchart showing wavelength-changeable current control used in Example 1.

FIG. 13A is a graph showing the wavelength characteristic with respect to the temperature of the SHG device. FIG. 13B is a graph showing the wavelength characteristic with respect to the temperature of the SHG laser. FIG. 13C is a graph showing the second harmonic power characteristics with respect to the temperature of the SHG laser for an SHG device having ideal characteristics. FIG. 13D is a graph showing the second harmonic power characteristics with respect to the output wavelength of the SHG laser for an SHG device having varying characteristics. FIG. 13E is a graph showing the second harmonic power characteristics with respect to the temperature of the SHG laser for an SHG device having varying characteristics.

DESCRIPTION OF THE PREFERRED EMBODIMENTS

Hereinbelow, the present invention will be described by way of example with reference to the accompanying drawings.

EXAMPLE 1

In Example 1, the wavelength-changeable current is automatically set within the range where the oscillation wavelength of a DBR semiconductor laser does not mode-hop, to stabilize the second harmonic power of SHG output.

Figure 1:
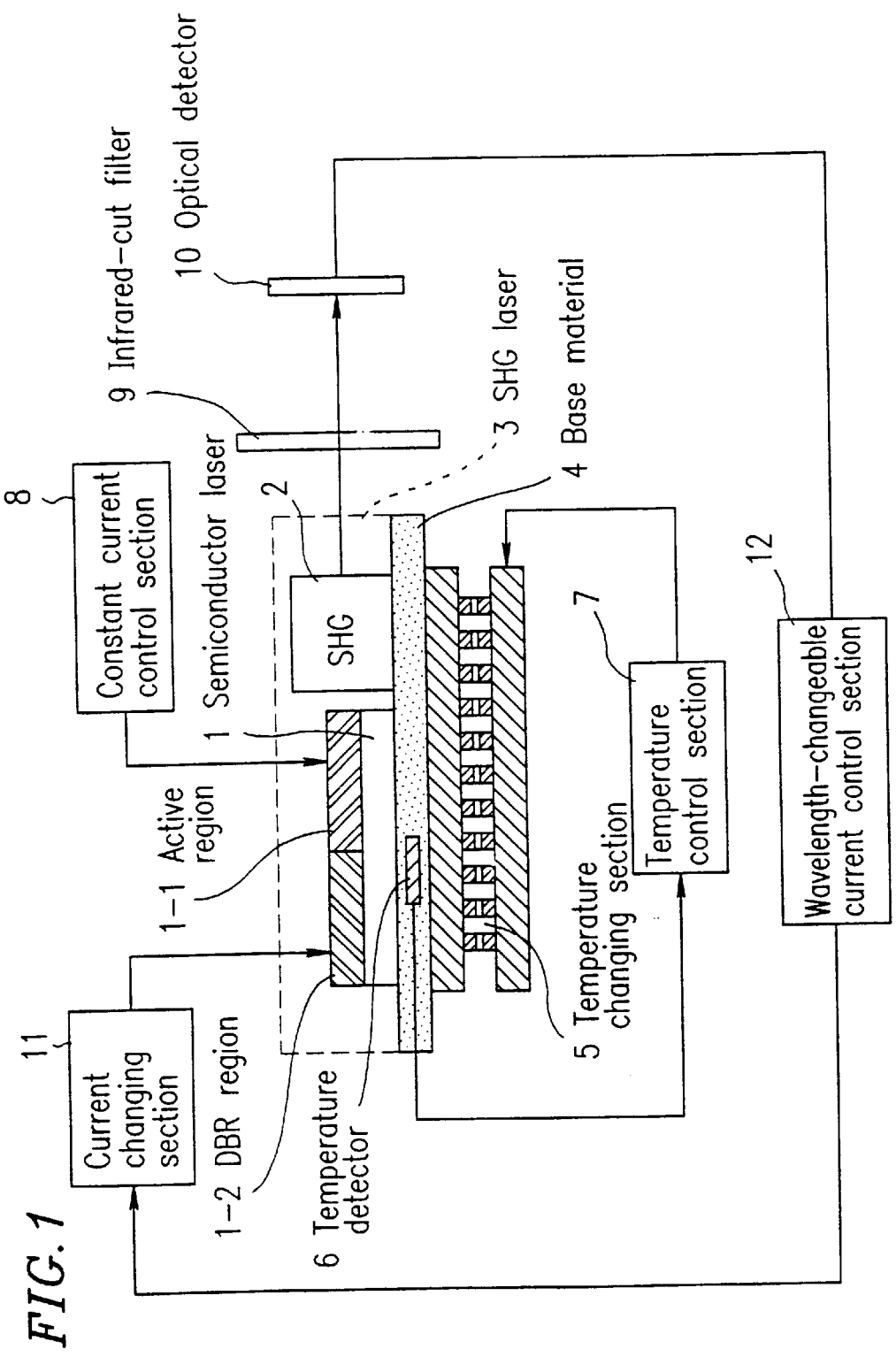
FIG. 1 is a block diagram schematically illustrating an SHG laser stabilizing control device of Example 1 according to the present invention.

FIG. 1 is a block diagram schematically illustrating an SHG laser stabilizing control device of Example 1 according to the present invention.

Referring to FIG. 1, a semiconductor laser 1 includes an active region 1-1 for providing a gain and a DBR region 1-2 for controlling the oscillation wavelength. An SHG laser 3 includes the semiconductor laser 1 and an SHG device 2 composed of a non-linear optical element which are integrally formed on a same base material 4.

The SHG laser 3 also includes a collimator lens, a $\lambda/2$ plate, and a focusing lens between the semiconductor laser 1 and the SHG device 2, though these components are omitted in FIG. 1. After a light beam emitted from the semiconductor laser 1 is collimated by the collimator lens, the polarization direction of the light beam is rotated by the $\lambda/2$ plate, and the resultant light beam is focused on an end face of an optical waveguide of the SHG device 2 by the focusing lens.

The control of the wavelength-changeable current according to the present invention is preferably performed in the state where the temperature of the SHG laser 3 has been stabilized at a predetermined value by temperature control which will be described later. Under the above state, a constant current control section 8 applies a constant current amount to the active region 1-1 of the semiconductor laser 1. A wavelength-changeable current control section 12 sets the oscillation wavelength of the semiconductor laser 1 within an allowance of the phase match wavelength of the SHG device 2 by controlling the wavelength-changeable current applied to the DBR region 1-2 of the semiconductor laser 1, and fixes the set oscillation wavelength. The SHG device 2 outputs laser light composed of a fundamental wave (850 nm) and a second harmonic (425 nm).

The laser light output from the SHG device 2 preferably passes through an infrared-cut filter 9, so that the fundamental wave is cut and only the second harmonic is incident on an optical detector 10 as the laser light. The output of the SHG device 2 is condensed on the optical detector 10 by placing a condensing lens (not shown) just behind the SHG device 2 so that a light spot is formed on the optical detector 10.

The optical detector 10 detects the intensity of the second harmonic from the SHG laser 3, and the output of the optical detector 10 is supplied to the wavelength-changeable current control section 12. The wavelength-changeable current control section 12 measures the output of the optical detector 10, i.e., the output of the SHG laser 3 and at the same time controls the wavelength-changeable current to be applied to the DBR region 1-2 by adjusting a current changing section 11.

A temperature changing section 5 (e.g., a Peltier element) which can electronically change a temperature is provided on the back surface of the base material 4 on the opposite surface of which the SHG laser 3 is integrally disposed. A temperature detector 6 is provided in the portion of the base material 4 closer to the semiconductor laser 1. A temperature control section 7 controls the temperature of the SHG laser 3 so that it attains a target temperature (e.g., 25° C.) by adjusting the current supplied to the temperature changing section 5 so that the temperature detected by the temperature detection section 6 become the target temperature.

Hereinbelow, the control of the wavelength-changeable current will be described in detail with reference to FIGS. 1, 2, 3, and 4A to 4D.

Figure 2:
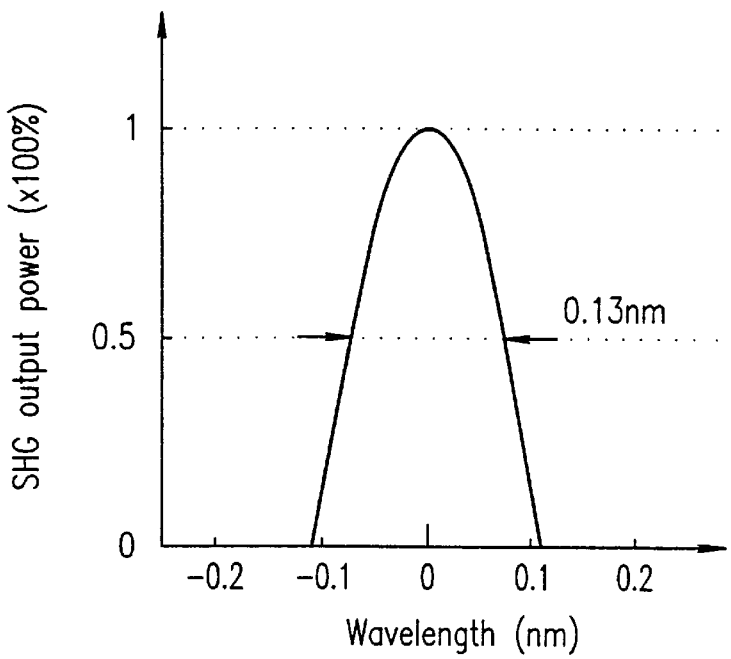
FIG. 2 is a graph showing the SHG device characteristics.
Figure 3:
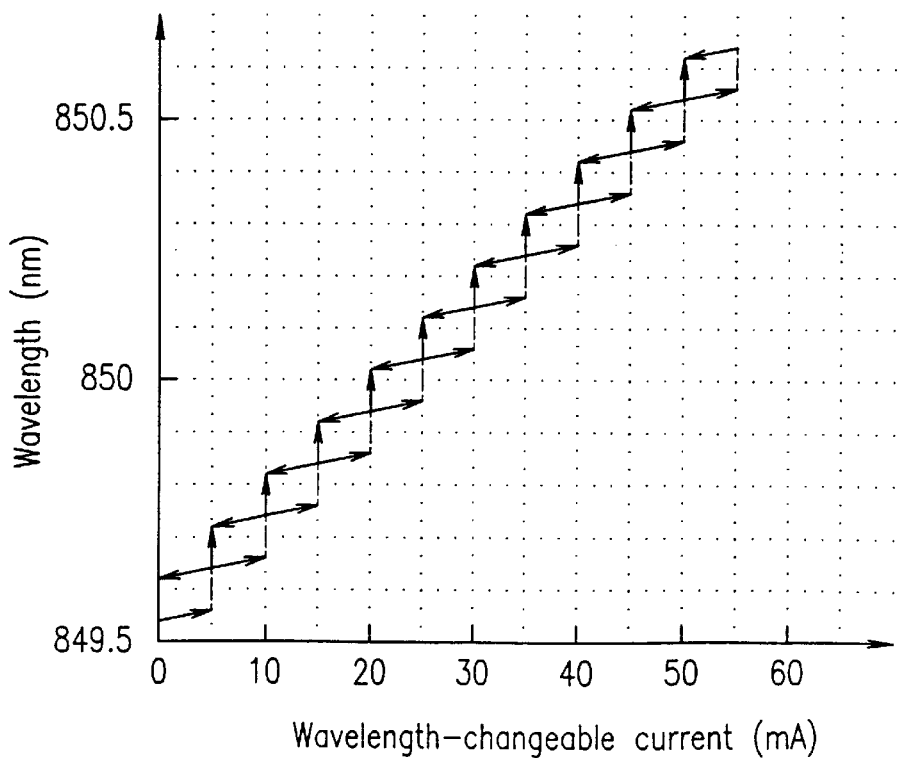
FIG. 3 is a graph showing the relationship between the wavelength-changeable current applied to a DBR region of a semiconductor laser and the output wavelength of the semiconductor laser.
Figure 4A:
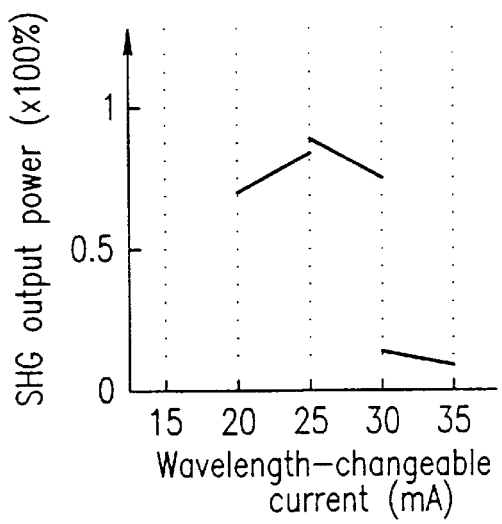
FIGS. 4A to 4D are graphs showing the relationships between the wavelength-changeable current for the semiconductor laser and the second harmonic power of the SHG laser.
Figure 4B:
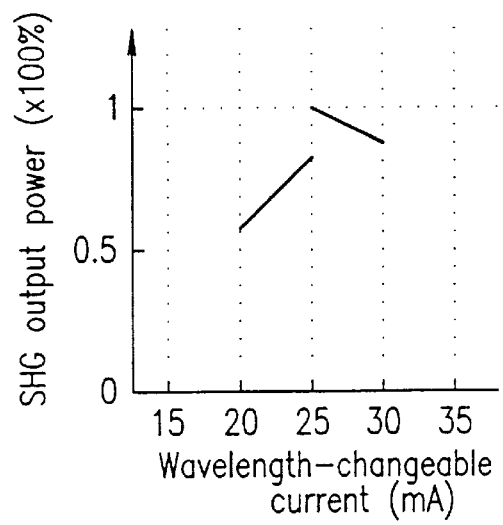
Figure 4C:
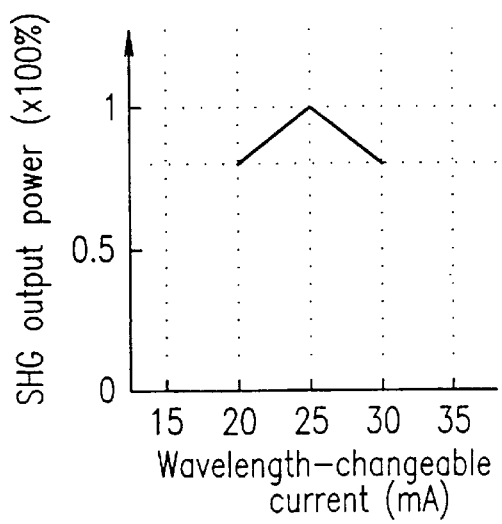
Figure 4D:
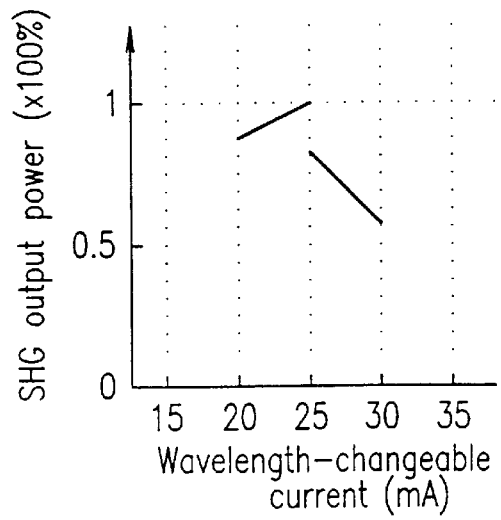

FIG. 2 is a graph showing the relationship between the wavelength of the second harmonic and the output power, exhibiting the characteristics of the SHG device 2. FIG. 3 is a graph showing the relationship between the wavelength-changeable current applied to the DBR region 1-2 of the semiconductor laser 1 and the output wavelength of the semiconductor laser 1. FIGS. 4A to 4D are graphs showing the relationships between the wavelength-changeable current and the second harmonic power output from the SHG laser 3. When the phase match conditions between the semiconductor laser 1 and the SHG device 2 are not constant due to a variation in the characteristics of the SHG device 2, characteristics as exhibited in FIGS. 4A, 4B, 4C, and 4D are obtained for the exemplified respective phase match conditions.

As is observed from FIG. 2, the half band width of the second harmonic of the SHG device 2 is 0.13 nm. As is observed from FIG. 3, the output of the semiconductor laser 1 shifts toward a longer wavelength as the wavelength-changeable current increases by repeated mode hopping every 5 mA of the wavelength-changeable current. The output wavelength of the semiconductor laser 1 changes by about 0.1 nm every mode hopping. As a result, as shown in FIGS. 4A to 4D, in the range of 15 to 35 mA of the wavelength-changeable current, the second harmonic power output from the SHG laser 3 has a waveform where it greatly changes at the boundary of each mode hopping (hereinbelow, called a mode boundary) while it continuously increases or decreases for an interval between adjacent mode boundaries (hereinbelow, called a mode interval). The degree of the gradient of the increase or decrease in the output power of the SHG laser 3 during the mode interval depends on the phase match conditions.

Assuming that the wavelength-changeable current is controlled so that the second harmonic power output from the SHG laser 3 is maximum, the wavelength-changeable current should be set at the mode boundary in either of FIGS. 4A to 4D, although the wavelength-changeable current may become maximum during a mode interval which is not shown in these figures. The probability that the wavelength-changeable current is set at the mode boundary is therefore very large. In such a case, the second harmonic power output from the SHG laser 3 is extremely unstable.

Considering a change amount $\Delta P$ of the second harmonic power P output from the SHG laser 3 at the mode boundary, a gap current value $I_{LDspmax}$ of the wavelength-changeable current, at which the change amount $\Delta P$ is at a maximum value, has been equal to a gap current value at the mode boundary which is located closest to a wavelength-changeable current $I_{LDpmax}$ at which the second harmonic power P is maximum on the side below the wavelength-changeable current $I_{LDpmax}$, or a gap current value at the mode boundary which is located closest to the wavelength-changeable current $I_{LDpmax}$ on the side above the wavelength-changeable current $I_{LDpmax}$.

The algorithm for the SHG laser stabilizing control device of Example 1 will be described with reference to FIGS. 5A, 5B, and 6.

Figure 5A:
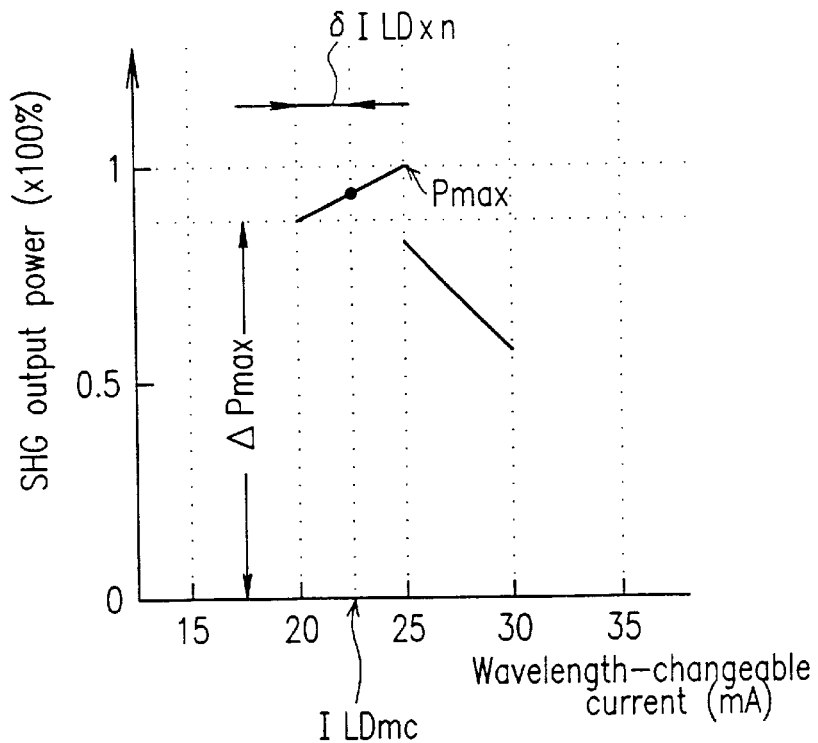
FIGS. 5A and 5B are views for illustrating the wavelength-changeable current control algorithm used in Example 1.
Figure 5B:
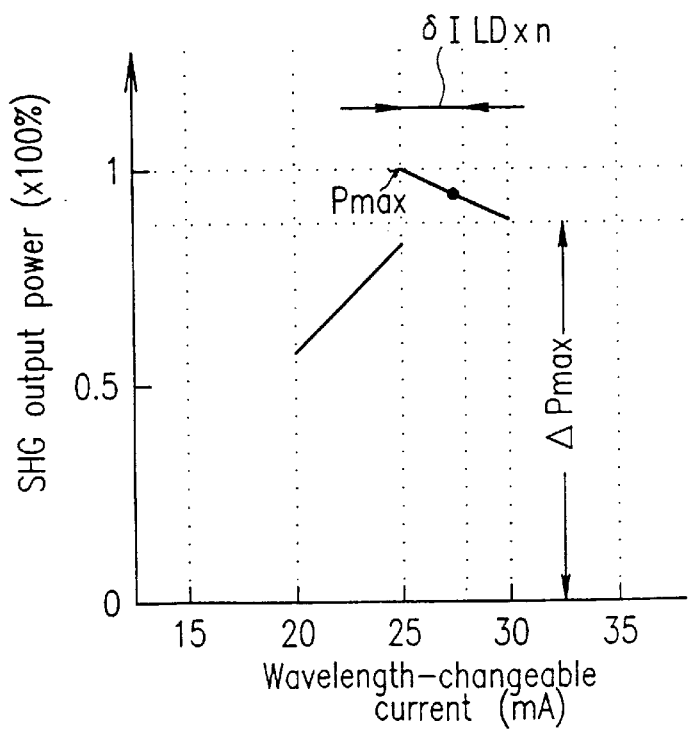

FIGS. 5A and 5B are graphs showing the relationship between the wavelength-changeable current and the second harmonic power output from the SHG laser 3 for respective different phase match conditions between the semiconductor laser 1 and the SHG device 2. FIG. 6 is a flowchart of the wavelength-changeable current control in Example 1.

First, the wavelength-changeable current control section 12 controls the current changing section 11 in response to a command instructing the start of the wavelength-changeable current control, to add a wavelength-changeable current change amount $\delta I_{LD}$ of 0.5 mA for each step to a wavelength-changeable current $I_{LD}$ so as to change the wavelength-changeable current $I_{LD}$ step by step in the range of about 0 to 112 mA, and thus to obtain the wavelength-changeable current $I_{LDpmax}$ at which the output of the optical detector 10, i.e., the output P of the SHG laser 3 is maximum (steps 101 and 102).

Thereafter, in order to avoid the wavelength-changeable current from being affected by the hysteresis of the semiconductor laser 1, the wavelength-changeable current control section 12 first sets the wavelength-changeable current at a sufficiently small value (e.g., a value smaller than $I_{LDpmax}$ by about 20 mA). Then, the wavelength-changeable current is increased to a predetermined value (e.g., a value larger than $I_{LDpmax}$ by about 20 mA) by 0.5 mA every step. In this way, the gap current value $I_{LDspmax}$ of the wavelength-changeable current, at which the change amount in the output of the optical detector 10, i.e., the change amount $\Delta P$ in the output of the SHG laser 3, is at a maximum value, has been obtained (steps 103 and 104).

The wavelength-changeable current control section 12 then determines whether or not $I_{LDspmax}$ is equal to or smaller than $I_{LDpmax}$ (step 105). If yes, a wavelength-changeable current return amount corresponding to n-times (n is an integer) the wavelength-changeable current change amount $\delta I_{LD}$ for each step is added to $I_{LDspmax}$, to obtain an inner-mode wavelength-changeable current $I_{LDmc}$ in the mode interval (step 106). If no (i.e., if $I_{LDspmax}$ is larger than $I_{LDpmax}$), the wavelength-changeable current return amount corresponding to n-times the wavelength-changeable current change amount $\delta I_{LD}$ for each step is subtracted from $I_{LDspmax}$, to obtain an inner-mode wavelength-changeable current $I_{LDmc}$ in the mode interval (step 107).

The wavelength-changeable current return amount is preferably set at about 2.5 mA by selecting 5 as n since the width of the mode interval is 5 mA. This allows the inner-mode wavelength-changeable current $I_{LDmc}$ to be set as the wavelength-changeable current substantially corresponding to the center of the mode interval. Alternatively, preferably, the value of n may be appropriately determined in the range of 2 to m−2 where m is an integer obtained by dividing a change in the wavelength-changeable current at the shifting from one mode boundary to the next mode boundary by the wavelength-changeable current change amount $\delta I_{LD}$.

After the inner-mode wavelength-changeable current $I_{LDmc}$ is obtained as described above, in order to avoid the wavelength-changeable current from being affected by the hysteresis of the semiconductor laser 1, the wavelength-changeable current control section 12 sets the wavelength-changeable current at a sufficiently small value. Then, the wavelength-changeable current to be applied to the DBR region 1-2 of the semiconductor laser 1 is gradually increased to be set at the inner-mode wavelength-changeable current $I_{LDmc}$ (step 108).

The processing of the comparison between $I_{LDspmax}$ and $I_{LDpmax}$ in the above control algorithm is represented as follows.

if $I_{LDspmax} \leq I_{LDpmax}$ then $I_{LDmc} = I_{LDspmax} + \delta I_{LD} \times n$ if $I_{LDspmax} > I_{LDpmax}$ then $I_{DBRmc} = I_{DBRspmax} - \delta I_{DBR} \times n$ The wavelength-changeable current control section 12 for realizing the above control algorithm is preferably composed of a digital signal processor (DSP) including an A/D converter which receives the output of the optical detector 10 and a D/A converter which controls the current changing section 11, and the like for software processing.

By setting the wavelength-changeable current applied to the DBR region 1-2 of the semiconductor laser 1 at the inner-mode wavelength-changeable current $I_{LDmc}$ as described above, since the inner-mode wavelength-changeable current $I_{LDmc}$ can be set to be sufficiently apart from the gap current value at the mode boundary, the second harmonic power output from the SHG laser 3 can be stabilized at around the maximum thereof.

Hereinbelow, alternative wavelength-changeable current control of Example 1 according to the present invention will be described with reference to the flowchart shown in FIG. 7.

Figure 7:
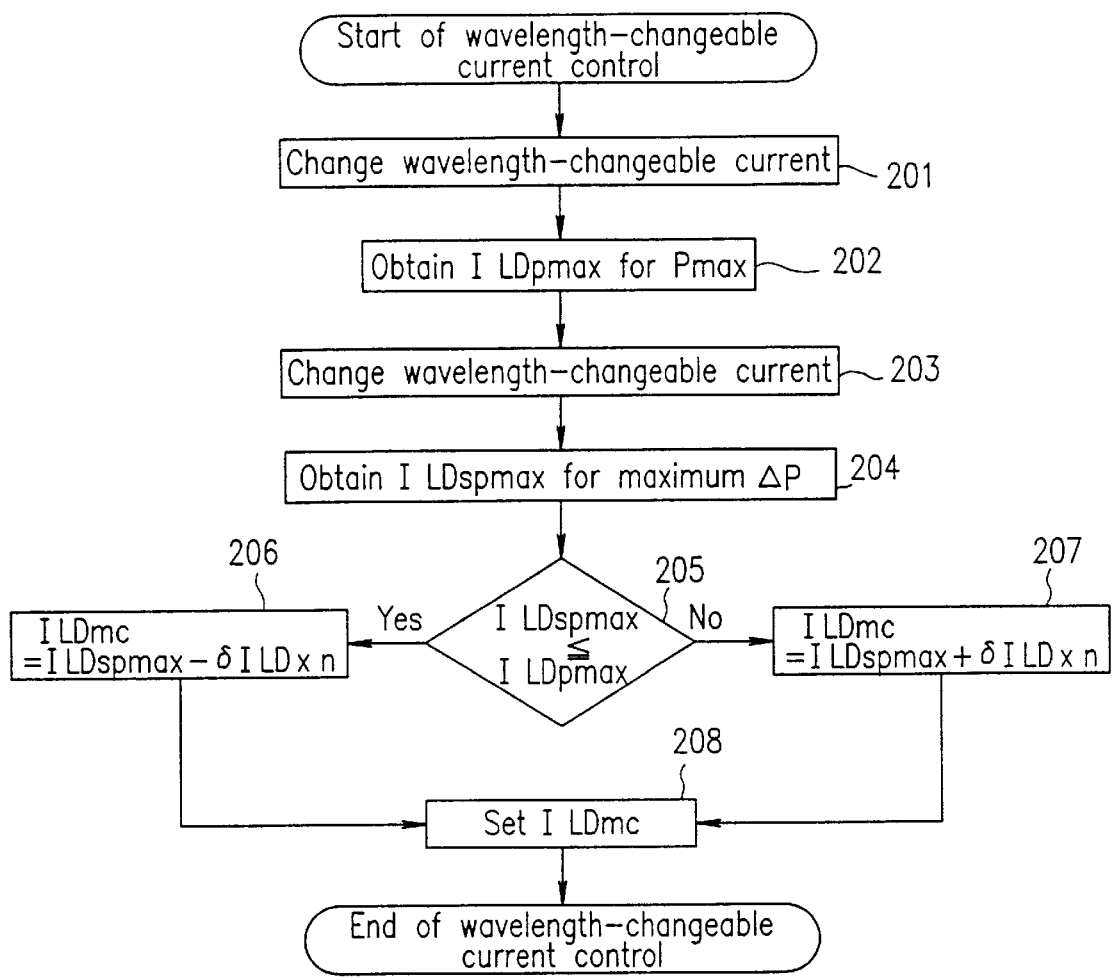
FIG. 7 is a flowchart showing alternative wavelength-changeable current control used in Example 1.

The processing of the flowchart shown in FIG. 7 is different from that shown in FIG. 6 in that, while the wavelength-changeable current is gradually increased in FIG. 6, it is gradually decreased in FIG. 7.

First, the wavelength-changeable current control section 12 controls the current changing section 11 in response to a command instructing the start of the wavelength-changeable current control, to subtract a wavelength-changeable current change amount $\delta I_{LD}$ of 0.5 mA for each step from the wavelength-changeable current $I_{LD}$ so as to change the wavelength-changeable current $I_{LD}$ in the range of about 0 to 112 mA, and thus to obtain the maximum wavelength-changeable current $I_{LDpmax}$ at which the output P of the SHG laser 3 detected by the optical detector 10 is maximum (steps 201 and 202).

Thereafter, in order to avoid the wavelength-changeable current from being affected by the hysteresis of the semiconductor laser 1, the wavelength-changeable current control section 12 sets the wavelength-changeable current at a sufficiently large value (e.g., a value larger than $I_{LDpmax}$ by about 20 mA). Then, the wavelength-changeable current is gradually decreased to a predetermined value (e.g., a value smaller than $I_{LDpmax}$ by about 20 mA) by 0.5 mA every step. In this way, the gap current value $I_{LDspmax}$ of the wavelength-changeable current, at which the change amount $\Delta P$ in the output of the SHG laser 3 detected by the optical detector 10 is at a maximum value, has been obtained (steps 203 and 204).

The wavelength-changeable current control section 12 then determines whether or not $I_{LDspmax}$ is equal to or smaller than $I_{LDpmax}$ (step 205). If yes, a wavelength-changeable current return amount corresponding to n-times (n is an integer) the wavelength-changeable current change amount $\delta I_{LD}$ for each step is subtracted from $I_{LDspmax}$, to obtain an inner-mode wavelength-changeable current $I_{LDmc}$ in the mode interval (step 206). If no (i.e., if $I_{LDspmax}$ is larger than $I_{LDpmax}$), the wavelength-changeable current return amount corresponding to n-times the wavelength-changeable current change amount $\delta I_{LD}$ for each step is added to $I_{LDspmax}$, to obtain an inner-mode wavelength-changeable current $I_{LDmc}$ in the mode interval (step 207).

After the inner-mode wavelength-changeable current $I_{LDmc}$ is obtained as described above, in order to avoid the wavelength-changeable current from being affected by the hysteresis of the semiconductor laser 1, the wavelength-changeable current control section 12 sets the wavelength-changeable current at a sufficiently large value. Then, the wavelength-changeable current to be applied to the DBR region 1-2 of the semiconductor laser 1 is gradually decreased to be set at the inner-mode wavelength-changeable current $I_{LDmc}$ (step 208).

The processing of the comparison between $I_{LDspmax}$ and $I_{LDpmax}$ in the above control algorithm is represented as follows.

if $I_{LDspmax} \leq I_{LDpmax}$ then $I_{LDmc} = I_{LDspmax} - \delta I_{LD} \times n$ if $I_{LDspmax} > I_{LDpmax}$ then $I_{DBRmc} = I_{DBRspmax} + \delta I_{DBR} \times n$

EXAMPLE 2

In Example 1, the wavelength-changeable current return amount is added to or subtracted from the maximum gap current value $I_{LDspmax}$, to obtain the inner-mode wavelength-changeable current $I_{LDmc}$ in the mode interval.

In Example 2, first and second threshold values are sequentially obtained to determine the gap current value from the second threshold value, and the wavelength-changeable current return amount is added to or subtracted from the gap current value, to obtain the inner-mode wavelength-changeable current in the mode interval.

Accordingly, Example 2 is the same as Example 1 in that the second harmonic power of the SHG output is stabilized by automatically setting the wavelength-changeable current, though the procedure until the inner-mode wavelength-changeable current is obtained in Example 2 is different from that in Example 1.

The SHG laser stabilizing control device of this example has the same configuration as the device of Example 1. Only the algorithm for controlling the wavelength-changeable current by the wavelength-changeable current control section 12 is different. In this example, therefore, only the algorithm for controlling the wavelength-changeable current by the wavelength-changeable current control section 12 will be described.

Figure 8A:
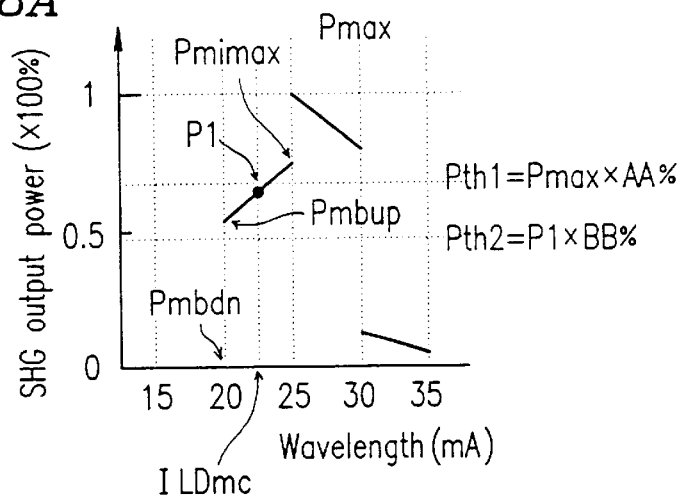
FIGS. 8A to 8C are views for illustrating a wavelength-changeable current control algorithm used in Example 2 according to the present invention.
Figure 8B:
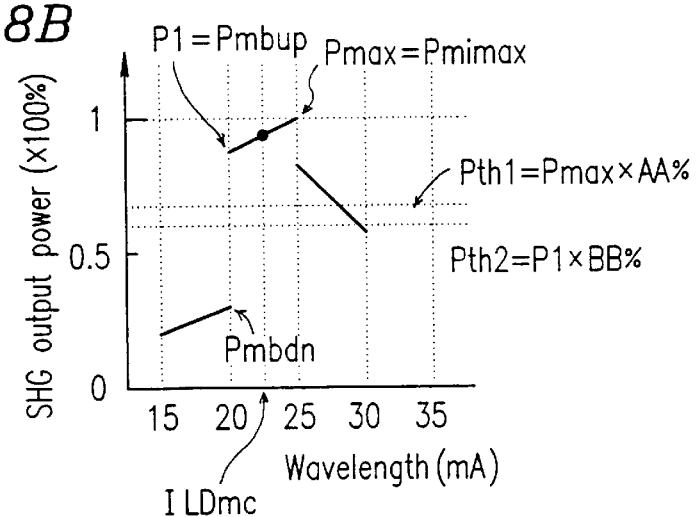
Figure 8C:
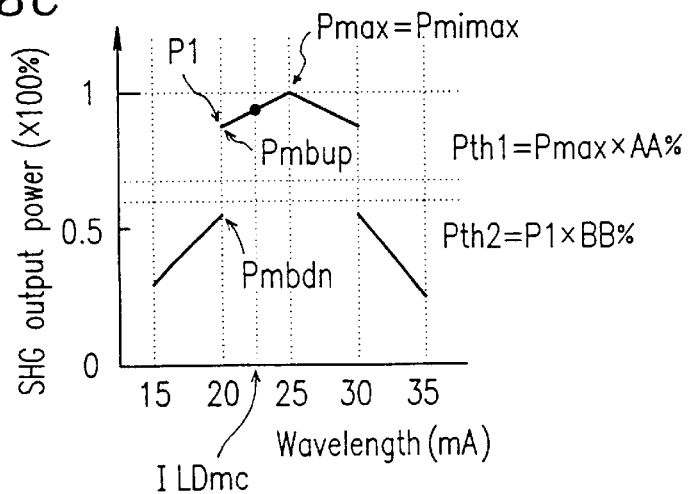
Figure 9:
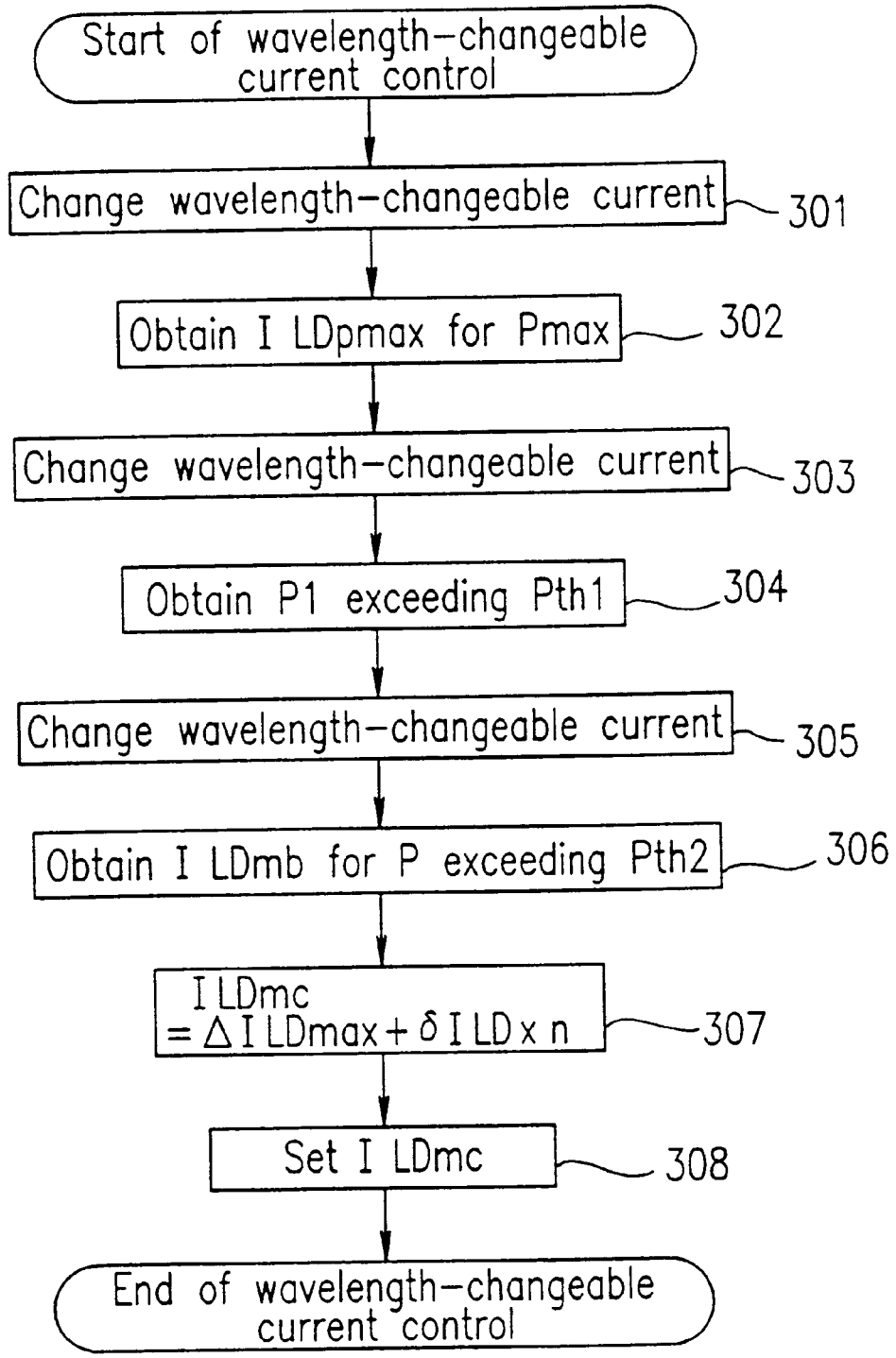
FIG. 9 is a flowchart showing the wavelength-changeable current control used in Example 2.

FIGS. 8A to 8C are graphs showing the relationships between the wavelength-changeable current and the second harmonic power output from the SHG laser 3 for respective different phase match conditions between the semiconductor laser 1 and the SHG device 2. FIG. 9 is a flowchart of the wavelength-changeable current control in Example 2.

First, the wavelength-changeable current control section 12 controls the current changing section 11 in response to a command instructing the start of the wavelength-changeable current control, to add a wavelength-changeable current change amount $\delta I_{LD}$ of 0.5 mA for each step to the wavelength-changeable current $I_{LD}$ so as to change the wavelength-changeable current $I_{LD}$ step by step in the range of about 0 to 112 mA, and thus to obtain the maximum output $P_{max}$ of the SHG laser 3 and the wavelength-changeable current $I_{LDpmax}$ which provides the maximum output $P_{max}$ (steps 301 and 302).

Then, the wavelength-changeable current control section 12 sets AA% (preferably, about 70%) of $P_{max}$ as a first threshold value $P_{th1}$, and, after a process step for avoiding the influence of the hysteresis of the semiconductor laser 1 has been performed, increases the wavelength-changeable current by 0.5 mA per step in a predetermined range (e.g., $I_{LDpmax} \pm 20$ mA) (step 303). The wavelength-changeable current control section 12 then obtains the output of the SHG laser 3 which has just exceeded the first threshold value $P_{th1}$ as an output $P_1$ (step 304).

Thereafter, the wavelength-changeable current control section 12 sets BB% (preferably, about 70%) of the output $P_1$ as a second threshold value $P_{th2}$, and, after a process step for avoiding the influence of the hysteresis of the semiconductor laser 1 has been performed, increases the wavelength-changeable current by 0.5 mA per step in a predetermined range (e.g., $I_{LDpmax} \pm 20$ mA) (step 305). The wavelength-changeable current control section 12 then obtains the wavelength-changeable current applied when the output P of the SHG laser 3 has just exceeded the second threshold value $P_{th2}$, to determine this wavelength-changeable current as the gap current value $I_{LDmb}$ at the mode boundary (step 306).

Subsequently, the wavelength-changeable current control section 12 adds the wavelength-changeable current return amount corresponding to n-times (n is an integer) the wavelength-changeable current change amount $\delta I_{LD}$ for each step to the obtained gap current value $I_{LDmb}$ at the mode boundary, to obtain an inner-mode wavelength-changeable current $I_{LDmc}$ in the mode interval (step 307).

The wavelength-changeable current return amount is preferably set at about 2.5 mA by selecting 5 as n since the width of the mode interval is 5 mA. This allows the inner-mode wavelength-changeable current $I_{LDmc}$ to be set at the wavelength-changeable current substantially corresponding to the center of the mode interval. Alternatively, the wavelength-changeable current return amount may be obtained based on a difference current between a first wavelength-changeable current at one mode boundary and a second wavelength-changeable current at the next mode boundary. In this case, the wavelength-changeable current return amount is appropriately set in the range of 20 to 80% of the difference current.

After the inner-mode wavelength-changeable current $I_{LDmc}$ is obtained as described above and a processing for avoiding the influence of the hysteresis of the semiconductor laser 1 is performed, the wavelength-changeable current applied to the DBR region 1-2 of the semiconductor laser 1 is gradually increased, to be set at the inner-mode wavelength-changeable current $I_{LDmc}$ (step 308).

In the above-described algorithm, in order to set a precise inner-mode wavelength-changeable current $I_{LDmc}$, the following conditions need to be satisfied.

(Condition 1)

The first threshold value $P_{th1}$ must be set to be equal to or smaller than a maximum value $P_{mimax}$ of the output of the SHG laser 3 in the mode interval from the mode boundary which is closest to the maximum output $P_{max}$ on the side below the wavelength-changeable current $I_{LDpmax}$ corresponding to the maximum output $P_{max}$ of the SHG laser 3 to the mode boundary corresponding to the wavelength-changeable current $I_{LDpmax}$.

This condition is represented by expression (1) below.

$$P_{mimax} \geq P_{th1} = P_{max} \times AA\% \tag{1}$$

(Condition 2)

The second threshold value $P_{th2}$ must be set between a larger value $P_{mbup}$ and a smaller value $P_{mbdn}$ of the output of the SHG laser 3 which changes in a step-wise manner at the mode boundary closest to the maximum output $P_{max}$ on the side below the wavelength-changeable current $I_{LDpmax}$ corresponding to the maximum output $P_{max}$ of the SHG laser 3.

This condition is represented by expression (2) below.

$$P_{mbdn} < P_1 \times BB\% < P_{mbup} \quad (2)$$

(Condition 3)

The relationship between AA% in expression (1) and BB% in expression (2) must satisfy expression (3) below.

$$AA\% \leq BB\% \quad (3)$$

If conditions 1 to 3 above are neglected, i.e., if AA=BB= 50(%) is set, for example, to perform the processing of the flowchart of FIG. 9, a precise inner-mode wavelength-changeable current $I_{LDmc}$ can be set in the cases of FIGS. 8A and 8B. In the case of FIG. 8C, however, the gap current value $I_{LDmb}$ cannot be precisely obtained. Thus, a precise inner-mode wavelength-changeable current $I_{LDmc}$ cannot be set.

If conditions 1 to 3 are satisfied, the gap current value $I_{LDmb}$ can be precisely obtained in FIG. 8C. Thus, a precise inner-mode wavelength-changeable current $I_{LDmc}$ can be set.

More specifically, in this example, in the case where the first threshold value $P_{th1}$ is set at the mode boundary, the output $P_1$ of the SHG laser 3 which has just exceeded the first threshold value $P_{th1}$ is increased in a step-wise manner up to the maximum output $P_{max}$. Accordingly, the second threshold value $P_{th2}$ which is slightly smaller than the first threshold value $P_{th1}$ is obtained from the output $P_1$. Based on the second threshold value $P_{th2}$, the gap current value $I_{LDmb}$ at the mode boundary can be obtained. In the case where the first threshold value $P_{th1}$ is set outside the mode boundary, i.e., in the mode interval, the output $P_1$ of the SHG laser 3 which has just exceeded the first threshold value $P_{th1}$ is substantially equal to the threshold value $P_{th1}$. Accordingly, the second threshold value $P_{th2}$ which is sufficiently smaller than the first threshold value $P_{th1}$ is obtained from the output $P_1$. Since the second threshold value $P_{th2}$ is set at the mode boundary, the gap current value $I_{LDmb}$ at the mode boundary can be obtained based on the second threshold value $P_{th2}$. In this way, the gap current value $I_{LDmb}$ can be obtained precisely, and thus, a precise inner-mode wavelength-changeable current $I_{LDmc}$ can be set.

The wavelength-changeable control section 12 for realizing the above-described control algorithm is preferably composed of a digital signal processor (DSP) including an A/D converter which receives the output from the optical detector 10 and a D/A converter which controls the current changing section 11, and the like for software processing.

By setting the wavelength-changeable current applied to the DBR region 1-2 of the semiconductor laser 1 at the inner-mode wavelength-changeable current $I_{LDmc}$ as described above, since the inner-mode wavelength-changeable current $I_{LDmc}$ can be set to be sufficiently apart from the gap current value at the mode boundary, the second harmonic power from the SHG laser 3 can be stabilized at around the maximum thereof.

Hereinbelow, an alternative method of controlling the wavelength-changeable current according to the present invention will be described with reference to the flowchart shown in FIG. 10.

Figure 10:
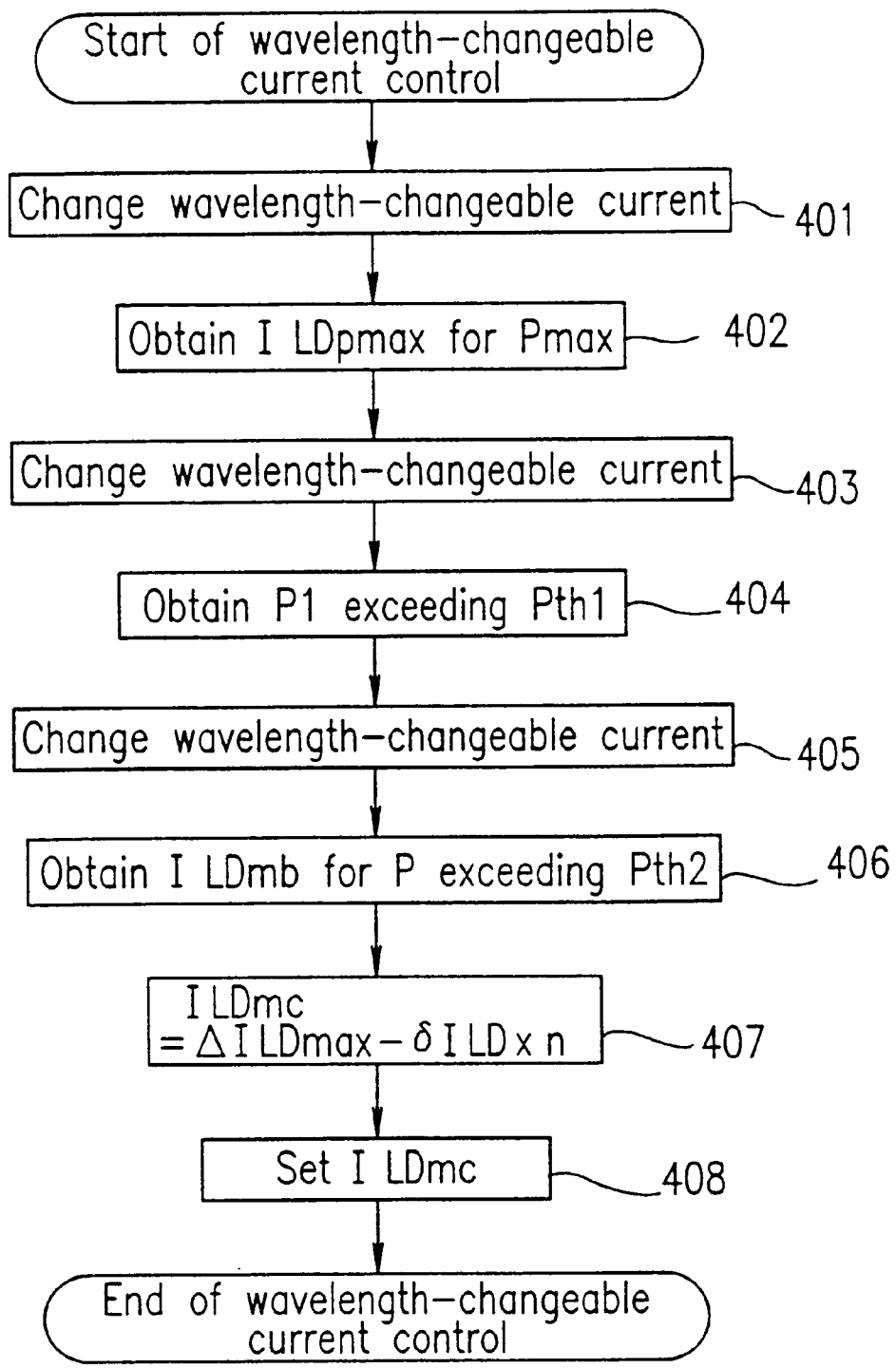
FIG. 10 is a flowchart showing alternative wavelength-changeable current control used in Example 2.

In comparison of the flowchart in FIG. 10 with that in FIG. 9, while the wavelength-changeable current is gradually increased in the processing shown in FIG. 9, it is gradually decreased in the processing shown in FIG. 10.

First, the wavelength-changeable current control section 12 controls the current changing section 11 in response to a command instructing the start of the wavelength-changeable current control, to subtract a wavelength-changeable current variation $\delta I_{LD}$ of 0.5 mA for each step from the wavelength-changeable current $I_{LD}$ so as to vary the wavelength-changeable current $I_{LD}$ step by step in the range of about 0 to 112 mA, and thus to obtain the maximum output $P_{max}$ and the wavelength-changeable current $I_{LDpmax}$ which provides the maximum output $P_{max}$ (steps 401 and 402).

Then, the wavelength-changeable current control section 12 sets AA% (preferably, about 70%) of $P_{max}$ as a first threshold value $P_{th1}$, and, after a process step for avoiding the influence of the hysteresis of the semiconductor laser 1 has been performed, decreases the wavelength-changeable current by 0.5 mA per step in a predetermined range (e.g., $I_{LDpmax} \pm 20$ mA) (step 403). The wavelength-changeable current control section 12 then obtains the output of the SHG laser 3 which has just exceeded the first threshold value $P_{th1}$ as an output $P_1$ (step 404).

Thereafter, the wavelength-changeable current control section 12 sets BB% (preferably, about 70%) of the output $P_1$ as a second threshold value $P_{th2}$, and, after a process step for avoiding the influence of the hysteresis of the semiconductor laser 1 has been performed, decreases the wavelength-changeable current by 0.5 mA per step in a predetermined range (e.g., $I_{LDpmax} \pm 20$ mA) (step 405). The wavelength-changeable current control section 12 then obtains the wavelength-changeable current applied when the output P of the SHG laser 3 has exceeded the second threshold value $P_{th2}$ to determine the wavelength-changeable current as the gap current value $I_{LDmb}$ at the mode boundary (step 406).

Subsequently, the wavelength-changeable current control section 12 subtracts the wavelength-changeable current return amount corresponding to n-times (n is an integer) the wavelength-changeable current variation $\delta I_{LD}$ for each step from the obtained gap current value $I_{LDmb}$ at the mode boundary, to obtain an inner-mode wavelength-changeable current $I_{LDmc}$ in the mode interval (step 407).

The wavelength-changeable current return amount is preferably set at about 2.5 mA by selecting 5 as n since the width of the mode interval is 5 mA. This allows the inner-mode wavelength-changeable current $I_{LDmc}$ to be set at the wavelength-changeable current substantially corresponding to the center of the mode interval. Alternatively, the wavelength-changeable current return amount may be obtained based on a difference current between a first wavelength-changeable current at one mode boundary and a second wavelength-changeable current at the next mode boundary. In this case, the wavelength-changeable current return amount is appropriately set in the range of 20 to 80% of the difference current.

After the inner-mode wavelength-changeable current $I_{LDmc}$ is obtained as described above and a processing for avoiding the influence of the hysteresis of the semiconductor laser 1 is performed, the wavelength-changeable current applied to the DBR region 1-2 of the semiconductor laser 1 is gradually decreased, to be set at the inner-mode wavelength-change able current $I_{LDmc}$ (step 408).

In the above-described algorithm, in order to set a precise inner-mode wavelength-changeable current $I_{LDmc}$, the following conditions need to be satisfied.

(Condition 1)

The first threshold value $P_{th1}$ must be set to be equal to or smaller than the maximum value $P_{mimax}$ of the output of the SHG laser 3 in the mode interval from the mode boundary which is closest to the maximum output $P_{max}$ on the side below the wavelength-changeable current $I_{LDpmax}$ corresponding to the maximum output $P_{max}$ of the SHG laser 3 to the mode boundary corresponding to the wavelength-changeable current $I_{LDpmax}$.

This condition is represented by expression (4) below.

$$P_{mimax} \leq P_{th1} = P_{max} \times AA\% \quad (4)$$

(Condition 2)

The second threshold value $P_{th2}$ must be set between a larger value $P_{mbup}$ and a smaller value $P_{mbdn}$ of the output of the SHG laser 3 which changes in a step-wise manner at the mode boundary closest to the maximum output $P_{max}$ on the side below the wavelength-changeable current $I_{LDpmax}$ corresponding to the maximum output $P_{max}$ of the SHG laser 3.

This condition is represented by expression (5) below.

$$P_{mbdn} < P_1 \times BB\% < P_{mbup} \quad (5)$$

(Condition 3)

The relationship between AA% in expression (4) and BB% in expression (5) must satisfy expression (6) below.

$$AA\% \leq BB\% \quad (6)$$

The wavelength-changeable control section 12 for realizing the above-described control algorithm is preferably composed of a digital signal processor (DSP) including an A/D converter which receives the output from the optical detector 10 and a D/A converter which controls the current changing section 11, and the like for software processing.

By setting the wavelength-changeable current applied to the DBR region 1-2 of the semiconductor laser 1 at the inner-mode wavelength-changeable current $I_{LDmc}$ as described above, since the inner-mode wavelength-changeable current $I_{LDmc}$ can be set to be sufficiently apart from the gap current value at the mode boundary, the second harmonic power output from the SHG laser 3 can be stabilized at around the maximum thereof.

EXAMPLE 3

In Example 3, not only the wavelength-changeable current is automatically set as in Examples 1 and 2, but also the temperature of the SHG laser 3 is automatically controlled to set the second harmonic power of the SHG output at around the maximum thereof and to stabilize it.

Figure 11:
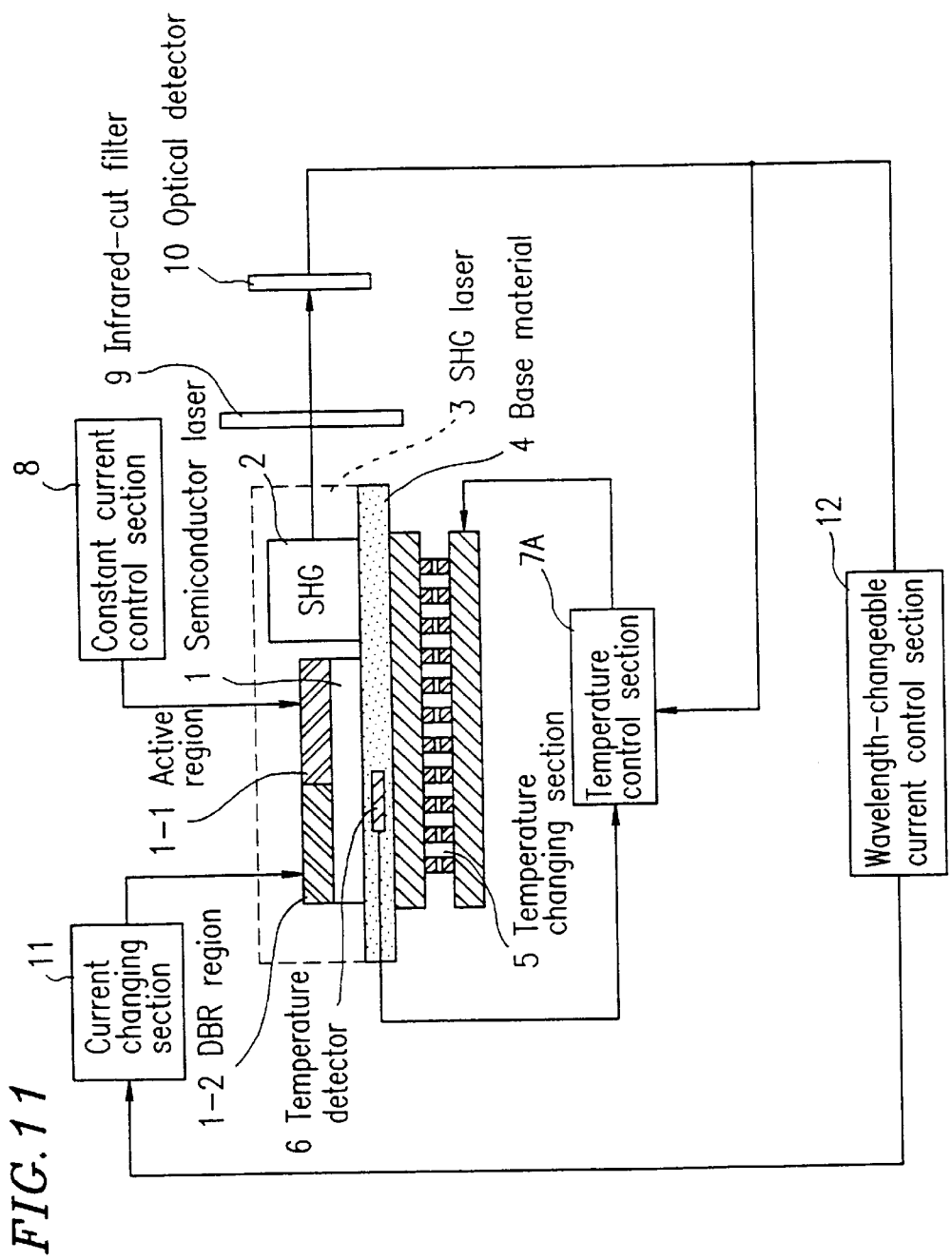
FIG. 11 is a block diagram schematically illustrating an SHG laser stabilizing control device of Example 3 according to the present invention.

FIG. 11 is a block diagram illustrating an SHG laser stabilizing control device of Example 3 according to the present invention. In FIG. 11, the components having the same functions as those in FIG. 1 are denoted by the same reference numerals, and the description thereof is omitted here.

In this example, a temperature control section 7A receives not only the temperature of the semiconductor laser 1 detected by the temperature detector 6, but also the second harmonic power of the SHG laser 3 detected by the optical detector 10, to realize the temperature control of the SHG laser 3.

The temperature control section 7A adjusts a current applied to the temperature changing section 5 so that the difference between the temperature detected by the temperatured detector 6 and a target temperature approaches zero. The temperature control section 7A also controls the target temperature so that the output of the SHG laser 3 detected by the optical detector 10 becomes a predetermined value.

The SHG laser stabilizing control device of this example preferably first performs the wavelength-changeable current control, as in Examples 1 and 2, where the wavelength-changeable current is controlled so that the output of the SHG laser 3 is stabilized at around the maximum thereof. Thereafter, the temperature control is performed by the temperature control section 7A where a temperature target value is changed to find a temperature at which the output of the SHG laser 3 becomes maximum.

Figure 12A:
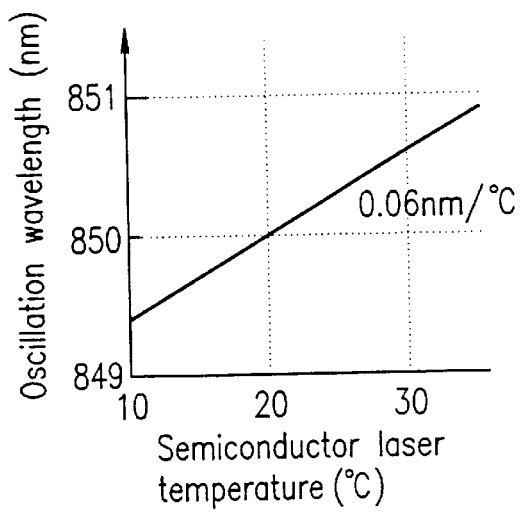
FIG. 12A is a graph showing the relationship between the temperature and the oscillation wavelength of the semiconductor laser.
Figure 12B:
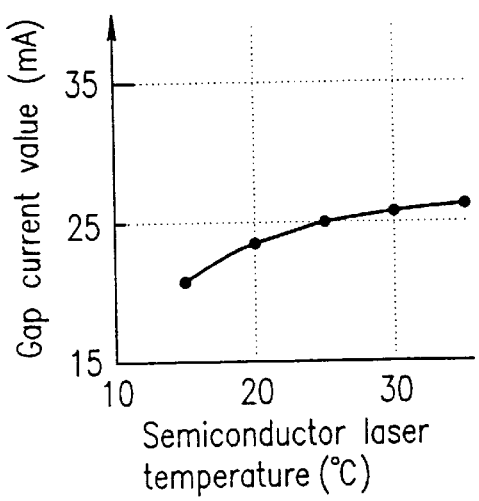
FIG. 12B is a graph showing the relationship between the temperature of the semiconductor laser and the gap current value at mode boundary.
Figure 12C:
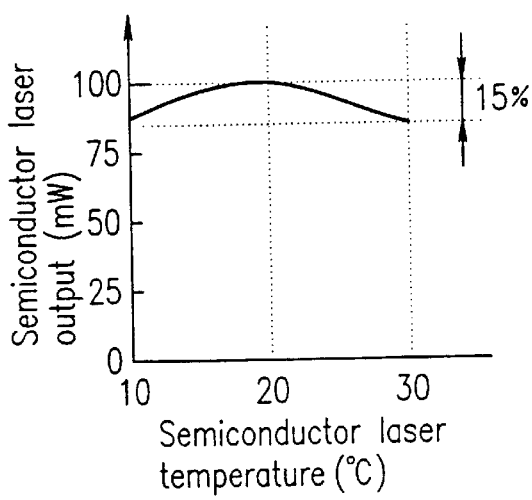
FIG. 12C is a graph showing the relationship between the temperature of the semiconductor laser and the output power characteristics of the semiconductor laser including the wavelength characteristic of the DBR region.

Referring to FIGS. 12A to 12C, the temperature characteristic of the SHG laser, in particular, the semiconductor laser 1 will be described.

FIG. 12A is a graph showing the relationship between the temperature and the oscillation wavelength of the semiconductor laser 1. As is observed from FIG. 12A, the oscillation wavelength of the semiconductor laser 1 changes by 0.06 nm as the temperature thereof changes by 1° C. In this example, the oscillation wavelength of the semiconductor laser 1 is 850 nm when the temperature thereof is 20° C.

FIG. 12B is a graph showing the relationship between the temperature of the semiconductor laser 1 and the gap current value at the mode boundary. In this example, the output of the semiconductor laser 1 mode-hops when the temperature of the semiconductor laser 1 is 25° C. and the wavelength-changeable current is 25 mA. The graph of FIG. 12B exhibits the characteristic where the wavelength-changeable current (the gap current value) changes as the temperature of the semiconductor laser 1 changes. In this example, when the temperature of the semiconductor laser 1 falls from 25° C. to 20° C., the gap wavelength-changeable current value changes from 25 mA to 23.5 mA. In reverse, when the temperature of the semiconductor laser 1 rises from 25° C. to 30° C., the gap current value changes from 25 mA to 26 mA.

FIG. 12C is a graph showing the output power characteristics of the semiconductor laser 1 including the wavelength characteristic of the DBR region 1-2 with respect to the temperature of the semiconductor laser 1. In this example, the output power of the semiconductor laser 1 becomes maximum when the temperature of the semiconductor laser 1 is 20° C.

Hereinbelow, referring to FIGS. 13A to 13E, the output power characteristics of the SHG laser 3 with respect to the temperature of the SHG laser 3 will be described.

FIG. 13A is a graph showing the wavelength characteristic with respect to the temperature of the SHG device 2. In this example, the temperature characteristic of the SHG device 2 is 0.035 nm/° C. That is, when light with a wavelength of 850 nm is incident on the SHG device 2 with a temperature of 20° C., a second harmonic of 425 nm is output.

FIG. 13B is a graph showing the wavelength characteristic with respect to the temperature of the SHG laser 3. This graph shows the wavelength characteristic of the SHG laser 3 as is observed from the side of the semiconductor laser 1. In this case, the wavelength characteristic of the SHG laser 3 is obtained by subtracting the wavelength characteristic of the SHG device 2, 0.035 nm/° C., from the wavelength characteristic of the semiconductor laser 1, 0.06 nm/° C. The wavelength characteristic of the SHG laser 3 with respect to the temperature thereof is therefore 0.025 nm/° C.

FIG. 13C is a graph showing the characteristics of the second harmonic power from the SHG laser 3 with respect to the temperature of the SHG laser 3 when it is assumed that the SHG device 2 has ideal characteristics. As is observed from FIG. 13C, in this example, the second harmonic output of 3 mW at maximum is obtained when the temperature is 20° C. under the assumption that the SHG device 2 has ideal characteristics. The characteristics of the second harmonic power with respect to the temperature is symmetric with respect to 20° C.

FIG. 13D is a graph showing the characteristics of the second harmonic power from the SHG laser 3 with respect to the output wavelength of the SHG laser 3 when it is assumed that the SHG device 2 has characteristics having a variation.

When the SHG device 2 has a variation such as non-uniformity in the wavelength of the SHG device 2, the characteristics of the second harmonic power from the SHG laser 3 with respect to the wavelength of the SHG laser 3 are asymmetric with respect to 20° C. and have two inflection points, as shown in the graph of FIG. 13D. The asymmetry and the number and positions of the inflection points vary depending on the characteristics of the device.

FIG. 13E is a graph showing the characteristics of the second harmonic power from the SHG laser 3 with respect to the temperature of the SHG laser 3 when the SHG device 2 has characteristics having a variation.

Since the wavelength characteristic with respect to the temperature of the SHG laser 3 is linear, the graph of FIG. 13E is obtained by replacing the wavelength of the x-axis in FIG. 13D with the temperature of the SHG laser 3.

Thus, as described above, if a specific variation such as non-uniformity in the wavelength of the SHG device 2 is found, the characteristics of the second harmonic power from the SHG laser 3 have a plurality of inflection points. Accordingly, when the maximum value of the output of the SHG laser 3 is searched by changing the temperature of the SHG laser 3 (for example, the second harmonic power is controlled to be maximum by a method of searching for an inflection point (maximal value) by changing the temperature by a predetermined step), it is required to correctly select the maximum one among the plurality of inflection points.

In this example, the maximum inflection point can be correctly selected by the temperature control section 7A, and the temperature of the SHG laser 3 is set at the temperature corresponding to the selected maximum inflection point.

The algorithm in this example will be roughly described. First, as in Examples 1 and 2, the wavelength-changeable current is controlled so that the second harmonic power from the SHG laser 3 is stabilized at around the maximum thereof. Thereafter, a temperature of the SHG laser 3 at which the second harmonic power further increases is searched for. As a measure against the case where a plurality of inflection points exist as described above, first, the output of the SHG laser 3 and the output of the temperature detector 6 are measured while the target temperature is largely changed in the range from a temperature lower by a predetermined amount to a temperature higher by a predetermined amount than the initial temperature of the SHG laser 3, so as to search for a temperature of the SHG laser 3 at which the second harmonic power from the SHG laser 3 is maximum. This procedure is herein referred to as a "rough temperature search". Thereafter, the temperature of the SHG laser 3 is changed in a range around the temperature obtained by the rough temperature search by a step with a predetermined temperature width, for example, 0.1° C. per step, to search for a temperature at which the output of the SHG laser 3 is maximum. This procedure is herein referred to as a "fine temperature search".

Hereinbelow, the algorithm for the SHG laser stabilizing control device of Example 3 will be described with reference to FIGS. 14 and 15.

Figure 14:
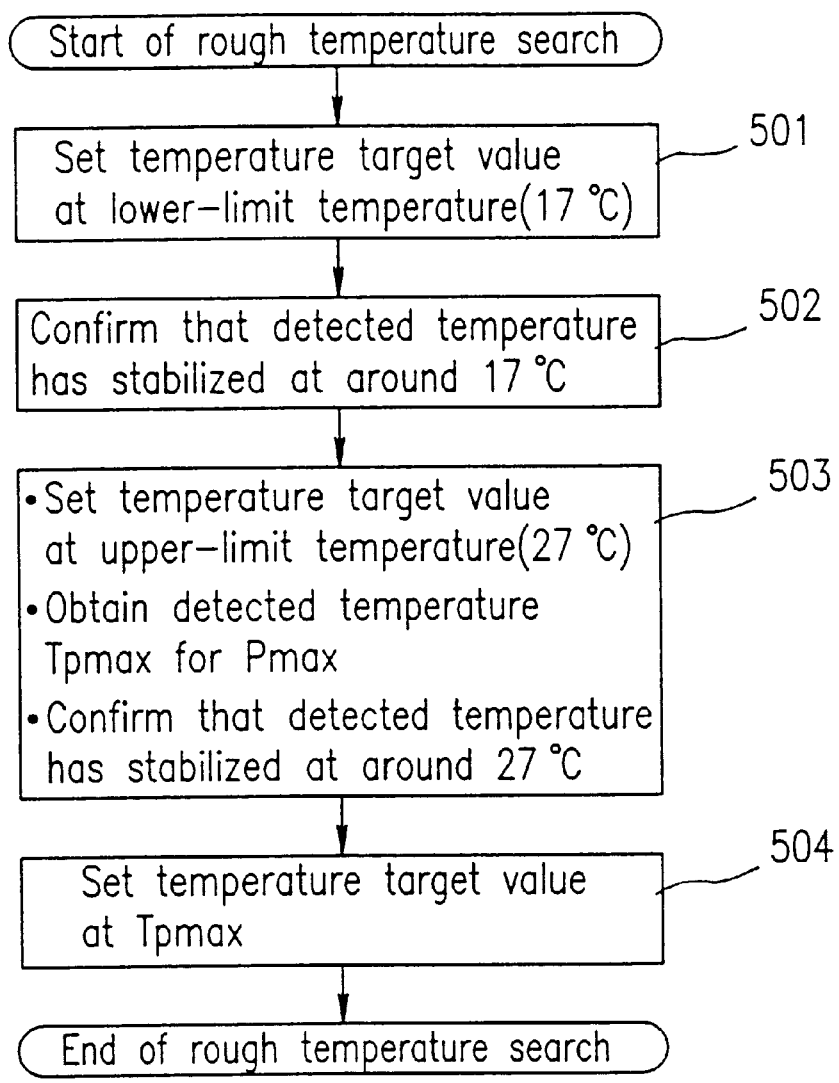
FIG. 14 is a flowchart showing rough temperature search control used in Example 3.

FIG. 14 is a flowchart showing the rough temperature search. First, in response to a command instructing the start of the rough temperature search, the temperature control section 7A sets a temperature target value at a lower-limit temperature, e.g., 17° C., which is lower by 5° C. than the initial temperature of the SHG laser 3, e.g., 22° C., detected by the temperature detection section 6. While monitoring the temperature of the SHG laser 3 detected by the temperature detection section 6, the temperature control section 7A then controls the temperature changing section 5 to adjust the temperature of the SHG laser 3 to the target temperature (step 501).

Then, the temperature control section 7A confirms that the temperature of the SHG laser 3 has been stabilized at around the target temperature, 17° C. (step 502). Subsequently, the temperature control section 7A sets the target temperature at an upper-limit temperature, e.g., 27° C., which is higher by 5° C. than the initial temperature. While monitoring the temperature of the SHG laser 3, the temperature control section 7A controls the temperature changing section 5 and increases the temperature of the SHG laser 3 up to the target temperature. This changes the temperature of the SHG laser 3 from 17° C. to 27° C. At this time, the temperature control section 7A also monitors the output of the optical detector 10, i.e., the output P of the SHG laser 3, to obtain a temperature $T_{pmax1}$ of the SHG laser 3 at which the output P is maximum. Then, the temperature control section 7A confirms that the temperature of the SHG laser 3 has been stabilized at around the target temperature, 27° C. (step 503).

Once the temperature $T_{pmax1}$ of the SHG laser 3 at which the output P of the SHG laser 3 is at a maximum value has been obtained, the temperature control section 7A controls the temperature changing section 5 while monitoring the temperature of the SHG laser 3, to set the temperature of the SHG laser 3 at the temperature $T_{pmax1}$ (step 504).

Figure 15:
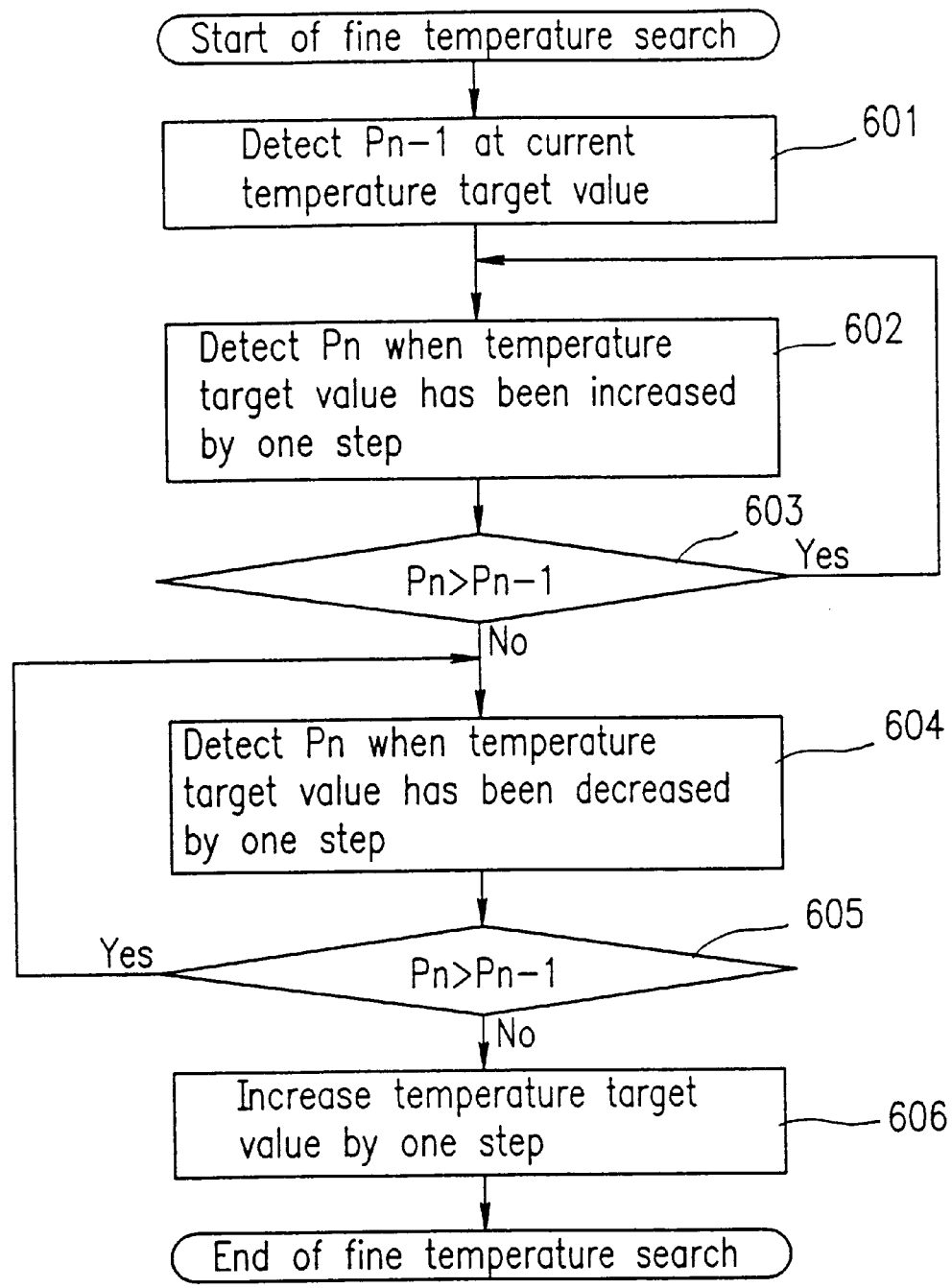
FIG. 15 is a flowchart showing fine temperature search control used in Example 3.

FIG. 15 is a flowchart showing the fine temperature search. First, in response to a command instructing the start of the fine temperature search, the temperature control section 7A samples an output ($P_{n-1}$) of the SHG laser 3 detected by the optical detector 10 when the temperature of the SHG laser 3 is $T_{pmax1}$ which has been set by the rough temperature search (step 601). Then, the temperature control section 7A sets the target temperature at a value higher, by a predetermined step width, e.g., 0.1° C. for one step, than the temperature $T_{pmax1}$. While monitoring the temperature of the SHG laser 3 detected by the temperature detection section 6, the temperature control section 7A controls the temperature changing section 5 to increase the temperature of the SHG laser 3 (step 602). Then, the temperature control section 7A determines whether or not an output $P_n$ of the SHG laser 3 is larger than the value before the change of the target temperature (step 603). If yes, the target temperature is further increased by 0.1° C., to increase the temperature of the SHG laser 3 (step 602), and again whether or not the output $P_n$ of the SHG laser 3 is larger than the value before the change of the target temperature is determined (step 603).

If no, (i.e., if the output $P_n$ of the SHG laser 3 is smaller than the value before the change of the target temperature), the temperature control section 7A sets the target temperature at a value lower by 0.1° C. for one step. While monitoring the temperature of the SHG laser 3 detected by the temperature detection section 6, the temperature control section 7A controls the temperature changing section 5 to decrease the temperature of the SHG laser 3 (step 604). Then, the temperature control section 7A determines whether or not the output $P_n$ of the SHG laser 3 is larger than the value before the change of the target temperature (step 605). If yes, the target temperature is further decreased by 0.1° C., to decrease the temperature of the SHG laser 3 (step 604), and again whether or not the output $P_n$ of the SHG laser 3 is larger than the value before the change of the target temperature is determined (step 605).

If no (i.e., if the output $P_n$ of the SHG laser 3 is smaller than the value before the change of the target temperature), the temperature control section 7A returns the target temperature to a higher value by 0.1° C. for one step, to obtain a target temperature $T_{pmax2}$. The temperature of the SHG laser 3 is increased by 0.1° C. for one step to be set at the temperature $T_{pmax2}$ and stabilized (step 606).

In this way, by changing the target temperature by 0.1° C. so that the output of the SHG laser 3 increases, the temperature $T_{pmax2}$ at which the output of the SHG laser 3 shifts from increase to decrease, i.e., the temperature at the inflection point (maximal value) of the output of the optical detector 10 is obtained. By setting the target temperature at the temperature $T_{pmax2}$ at the inflection point, the fine temperature search is terminated.

Thus, as described above, even if a plurality of inflection points exist in the second harmonic power from the SHG laser 3 due to a specific variation such as non-uniformity in the waveguide of the SHG device 2, the temperature of the SHG laser 3 can be set at the temperature at which the second harmonic power is maximum without fail.

Figure 16:
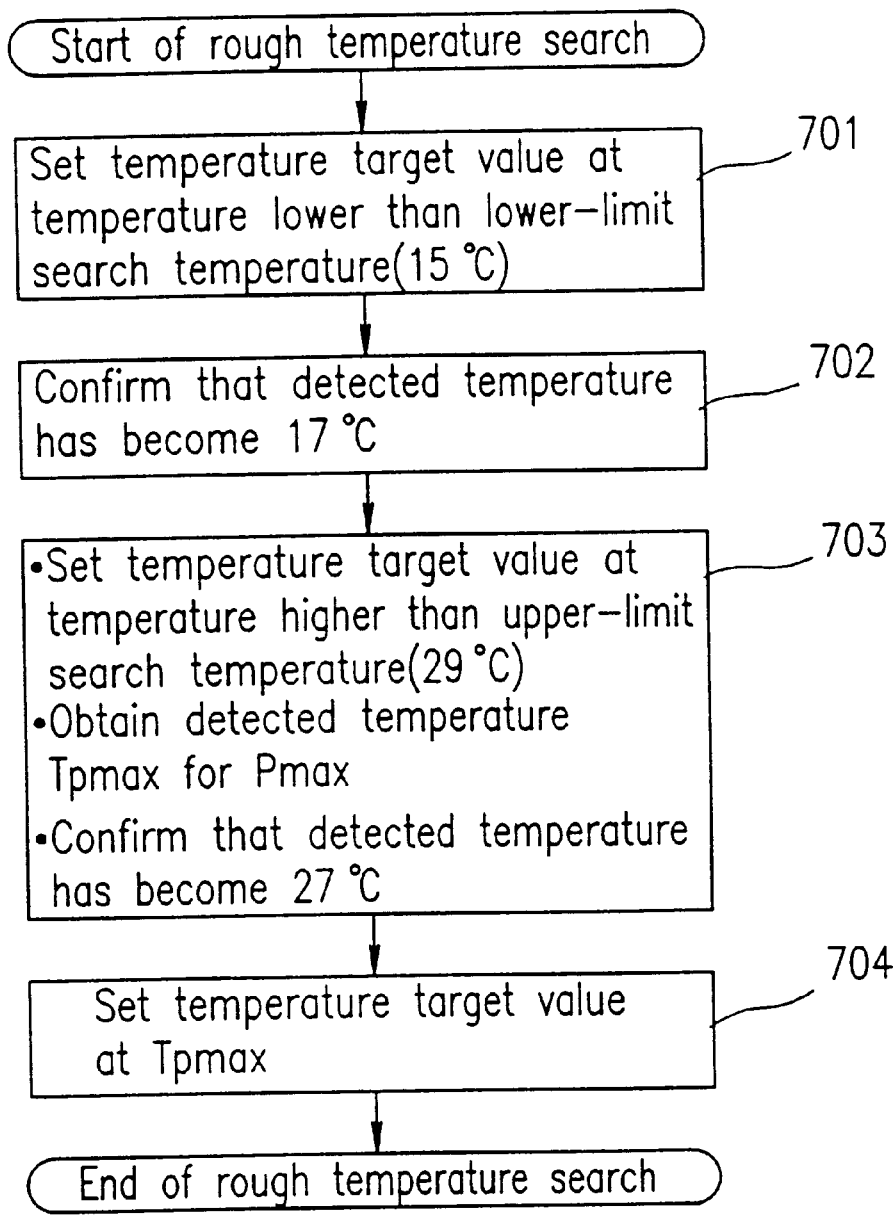
FIG. 16 is a flowchart showing alternative rough temperature search control used in Example 3.

An alternative example of the rough temperature search will be described with reference to the flowchart of FIG. 16. First, in response to a command instructing the start of the rough temperature search, the temperature control section 7A sets a lower-limit temperature, e.g., 17° C., which is lower by 5° C. than the initial temperature, e.g., 22° C., of the SHG laser 3 detected by the temperature detection section 6, and then sets a target temperature, e.g., 15° C., which is lower than the lower-limit temperature, 17° C. (step 701). The temperature control section 7A then controls the temperature changing section 5 so that the temperature of the SHG laser 3 reaches the target temperature, 15° C.

While the temperature of the SHG laser 3 is decreasing as described above, the temperature control section 7A confirms that the temperature of the SHG laser 3 reaches the lower-limit temperature, 17° C., before it reaches the target temperature, 15° C. (step 702). Upon this confirmation, the temperature control section 7A sets an upper-limit temperature, 27° C., which is higher by 5° C. than the initial temperature of the SHG laser 3, 22° C., and then sets a target temperature, 29° C., which is higher than the upper-limit temperature, 27° C. The temperature control section 7A then controls the temperature changing section 5 so that the temperature of the SHG laser 3 reaches the target temperature, 29° C. At this time, the temperature control section 7A monitors the output P of the SHG laser 3 to obtain a temperature $T_{pmax1}$ of the SHG laser 3 at which the output P is maximum. Then, the temperature control section 7A confirms that the temperature of the SHG laser 3 has reached a value around the target temperature, 27° C. (step 703).

Once the temperature $T_{pmax1}$ of the SHG laser 3 at which the output P is at a maximum value has been obtained, the temperature control section 7A controls the temperature changing section 5 while monitoring the temperature of the SHG laser 3, to set the temperature of the SHG laser 3 at the temperature $T_{pmax1}$ (step 704).

In this way, by setting the target temperatures at a temperature lower than the lower-limit temperature and a temperature higher than the upper-limit temperature, the temperature of the SHG laser 3 can be swiftly changed to the lower-limit temperature and the upper-limit temperature. Thus, the control time for the rough temperature search can be shortened.

In order to realize the above-described control algorithm, the temperature control section 7A is preferably composed of a digital signal processor (DSP) including an A/D converter which receives the output of the optical detector 10, an A/D converter which receives the output of the temperature detector 6, and a D/A converter which controls the current changing section 11, and the like for software processing.

EXAMPLE 4

In Example 4, not only the wavelength-changeable current is automatically set as in Examples 1 and 2, but also the output of the SHG laser 3 is stabilized by controlling the power-changeable current applied to the active region 1-1 of the semiconductor laser 1.

Figure 17:
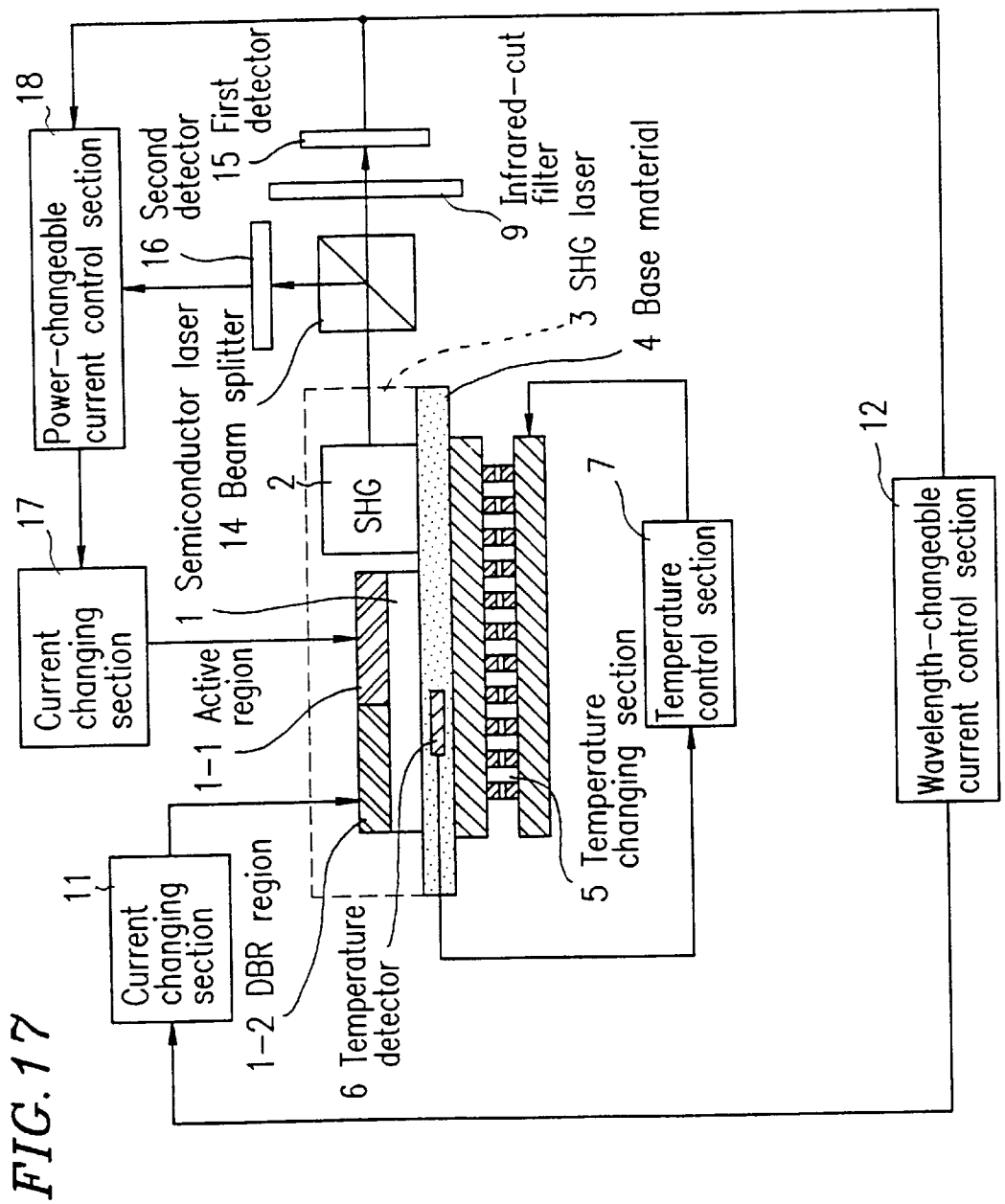
FIG. 17 is a block diagram schematically illustrating an SHG laser stabilizing control device of Example 4 according to the present invention.

FIG. 17 is a block diagram schematically illustrating an SHG laser stabilizing control device of Example 4 according to the present invention. In FIG. 17, the components having the same functions as those in FIG. 1 are denoted by the same reference numerals, and the description thereof is omitted here.

Referring to FIG. 17, the SHG laser stabilizing control device of this example includes a beam splitter 14 for splitting a light beam from the SHG laser 3, a first optical detector 15 for detecting the second harmonic laser light from the SHG laser 3 by receiving one of the split beam from the beam splitter 14 via the infrared-cut filter 9, a second optical detector 16 for detecting the other of the split beam, a current changing section 17 for applying a power-changeable current to the active region 1-1 of the semiconductor laser 1, and a power-changeable current control section 18 for controlling the power-changeable current to be applied to the active region 1-1 of the semiconductor laser 1 by controlling the current changing section 17.

In Example 1, the current to be applied to the active region 1-1 of the semiconductor laser 1 is made constant by the constant current control section 8. In Example 4, however, the power-changeable current to be applied to the active region 1-1 of the semiconductor laser 1 is con trolled by the power-changeable current control section 18 so that the output of the first optical detector 15 or the second optical detector 16 is made constant.

In this example, prior to the step to control the wavelength-changeable current, the power-changeable current control section 18 controls the power-changeable current to be applied to the active region 1-1 of the semiconductor laser 1 so that the output of the second optical detector 16 is made constant. In other words, the power-changeable current control section 18 controls the power-changeable current to be applied to the active region 1-1 of the semiconductor laser 1 so that the fundamental wave power from the SHG device 2 is made constant.

In the state where the power-changeable current is being controlled so that the fundamental wave power is made constant, while the temperature control is being performed as in Example 1 so that the temperature of the SHG laser 3 is made constant, the wavelength-changeable current is controlled so that the second harmonic power from the SHG laser 3 detected by the first optical detector 15 is stabilized at about the maximum thereof.

Upon completion of the wavelength-changeable current control, the power-changeable current control section 18 controls the power-changeable current to be applied to the active region 1-1 of the semiconductor laser 1 so that the output of the first optical detector 15 is made constant. In other words, the power-changeable current control section 18 controls the power-changeable current to be applied to the active region 1-1 of the semiconductor laser 1 so that the second harmonic power from the SHG device 2 is made constant.

When the output of the first optical detector 15 increases as a result of the change in the wavelength-changeable current, the fundamental power component decreases. In this example, at the control of the wavelength-changeable current control, the power-changeable current is controlled so that the fundamental wave power is made constant. Accordingly, the degree of the change in the second harmonic power with respect to the change in the wavelength-changeable current is large, compared with Example 1 where a constant current is applied to the active region 1-1. Thus, in the wavelength-changeable current control for stabilizing the second harmonic power from the SHG laser 3 at around the maximum thereof, the sensitivity of the detection of the second harmonic power from the SHG laser 3 with respect to the change in the wavelength-changeable current can be improved.

In this example, since the power-changeable current is controlled so that the second harmonic power from the SHG laser 3 is made constant after the wavelength-changeable current control, more stable second harmonic power can be obtained.

EXAMPLE 5

In Example 5, not only the wavelength-changeable current is automatically set as in Examples 1 and 2, but also the temperature of the SHG laser 3 is automatically controlled and the output of the SHG laser 3 is stabilized by controlling the current applied to the active region 1-1 of the semiconductor laser 1.

Figure 18:
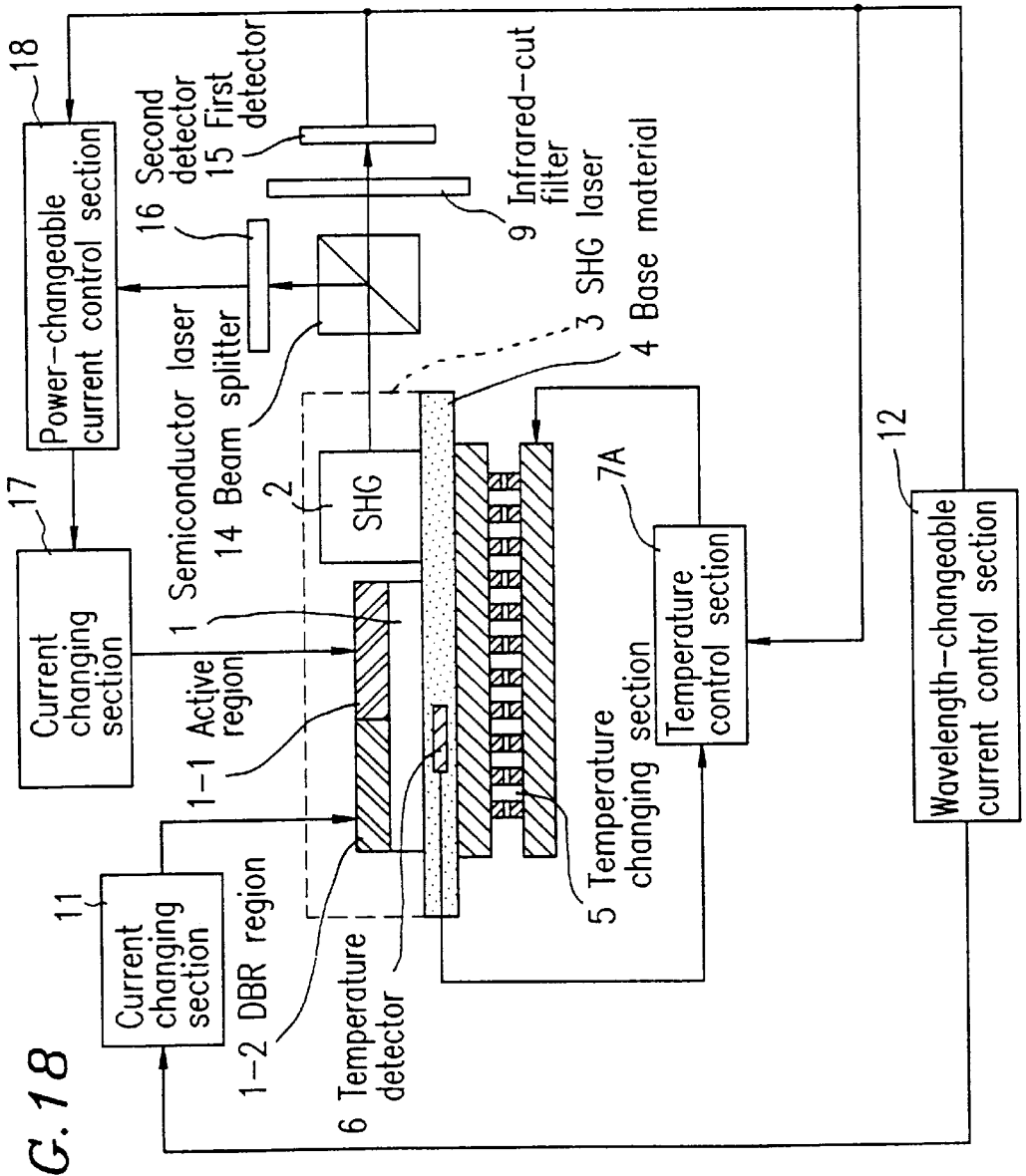
FIG. 18 is a block diagram schematically illustrating an SHG laser stabilizing control device of Example 5 according to the present invention.

FIG. 18 is a block diagram schematically illustrating an SHG laser stabilizing control device of Example 5 according to the present invention. In FIG. 18, the components having the same functions as those in FIG. 1 are denoted by the same reference numerals, and the description thereof is omitted here.

The device of Example 5 is different from the device of Example 4 in that the temperature control section 7A is used in place of the temperature control section 7, so that a temperature of the SHG laser 3 at which the second harmonic power from the SHG laser 3 is at a maximum value has been searched for (hereinbelow, this search is referred to as the "temperature search") as in Example 3.

In this example, at the wavelength-changeable correct control and the temperature search, the power-changeable current control section 18 controls the power-changeable current to be applied to the active region 1-1 of the semiconductor laser 1 so that the output of the second optical detector 16 is made constant. In other words, the power-changeable current control section 18 controls the power-changeable current to be applied to the active region 1-1 of the semiconductor laser 1 so that the fundamental wave power from the SHG laser 3 is made constant.

In the state where the power-changeable current is being controlled so that the fundamental wave power is made constant, preferably, after the wavelength-changeable current is controlled so that the output of the SHG laser 3 is stabilized at around the maximum thereof as in Example 1, the temperature control section 7A changes the temperature target value so as to search for a temperature at which the output of the SHG laser 3 is maximum, as in Example 3.

Upon completion of the wavelength-changeable current control and the temperature search, the power-changeable current control section 18 controls the power-changeable current to be applied to the active region 1-1 of the semiconductor laser 1 so that the output of the first optical detector 15 is made constant. In other words, the power-changeable current control section 18 controls the power-changeable current to be applied to the active region 1-1 of the semiconductor laser 1 so that the second harmonic power from the SHG device 2 is made constant.

When the output of the first optical detector 15 increases as a result of the change in the wavelength-changeable current or the temperature search, the fundamental power component decreases. In this example, at the wavelength-changeable current control, the power-changeable current is controlled so that the fundamental wave power is made constant. Accordingly, the degree of the change in the second harmonic power with respect to the change in the wavelength-changeable current is large, compared with Example 1 where a constant current is applied to the active region 1-1. Thus, in the wavelength-changeable current control for stabilizing the second harmonic power from the SHG laser 3 at around the maximum thereof and in the temperature search, the sensitivity of the detection of the second harmonic power from the SHG laser 3 with respect to the change in the wavelength-changeable current can be improved.

In this example, since the power-changeable current is controlled so that the second harmonic power from the SHG laser 3 is made constant after the wavelength-changeable current control, more stable second harmonic power can be obtained.

EXAMPLE 6

In Example 6, an optical disk recording/reproduction device using the SHG laser stabilizing control device of Example 5 will be described.

Figure 19:
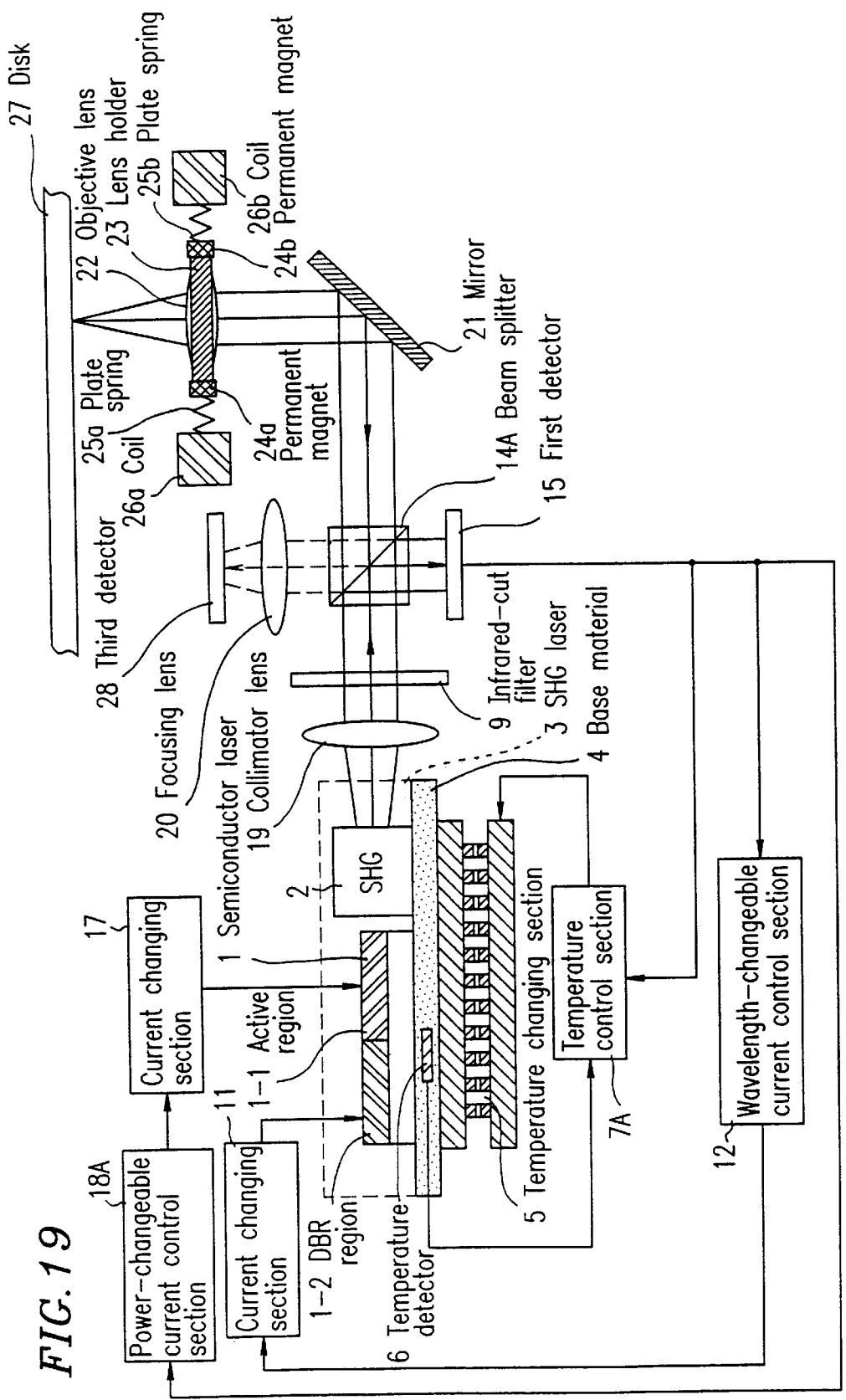
FIG. 19 is a block diagram of an optical disk reproduction device of Example 6 according to the present invention.
Figure 20:
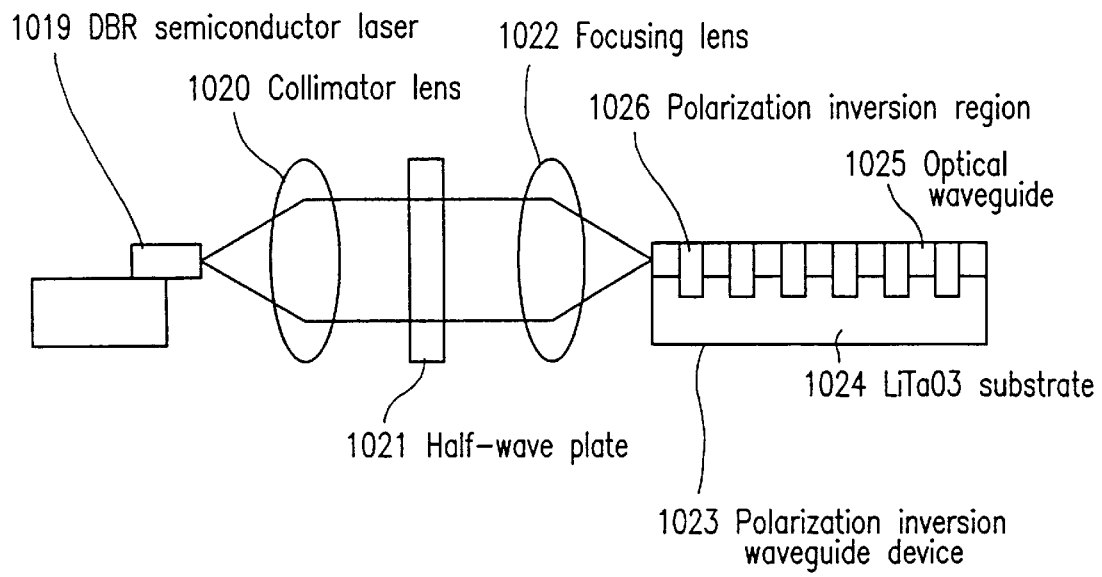
FIG. 20 is a schematic structural view of a conventional blue light source using a polarization inversion waveguide device.

FIG. 19 illustrates the optical disk recording/reproduction device of Example 6. In FIG. 19, the components having the same functions as those in FIG. 18 are denoted by the same reference numerals, and the description thereof is omitted here.

As is apparent from FIG. 19, the optical disk recording/reproduction device of this example includes a collimator lens 19, a focusing lens 20, a mirror 21, an objective lens 22, a lens holder 23, permanent magnets 24a and 24b, plate springs 25a and 25b, coils 26a and 26b, and a disk 27, as well as the SHG laser stabilizing device shown in FIG. 18.

The SHG laser stabilizing control device shown in FIG. 19 is different in the function from the device of FIG. 18, which will be supplementarily described as follows.

Referring to FIG. 19, output light from the SHG laser 3 is collimated by the collimator lens 19, and incident on the infrared-cut filter 9. The infrared-cut filter 9 cuts the fundamental wave component of the incident light and outputs laser light including only second harmonic. The laser light including only second harmonic is incident on a beam splitter 14A, which reflects part of the laser light of second harmonic. The reflected laser light is incident on the first optical detector 15. In this example, the wavelength-changeable current control, the temperature search, and the power-changeable current control are performed so that the second harmonic detected by the first optical detector 15 is stabilized at about the maximum thereof, in a manner similar to that described in Example 5. This control in this example is slightly different from Example 5 in that the fundamental wave from the SHG laser 3 is not detected.

A power-changeable current control section 18A in this example is different from the power-changeable current control section 18 in Example 5 in the SHG laser stabilizing control as follows.

In the device of Example 5 shown in FIG. 18, part of the output light of the SHG laser 3 is reflected by the beam splitter 14, and the reflected light, i.e., the fundamental wave is detected by the second optical detector 16. The output of the second optical detector 16 is input into the power-changeable current control section 18. At the wavelength-changeable current control, the power-changeable current control section 18 controls so that the fundamental power is made constant based on the output of the second optical detector 16.

On the contrary, in the device of this example shown in FIG. 19, the second harmonic from the SHG laser 3 passes through the infrared-cut filter 9 and is detected by a first optical detector 15. Only the output of the first optical detector 15 is incident on the power-changeable current control section 18A. Accordingly, the power-changeable current control section 18A fails to recognize the fundamental wave power from the SHG laser 3. For this reason, at the wavelength-changeable current control, a constant current is applied to the active region 1-1 of the semiconductor laser 1.

However, since the power-changeable current control section 18A can control the power-changeable current so that the second harmonic power from the SHG laser 3 is made constant after the wavelength-changeable current control, more stable second harmonic power can be obtained.

Referring to FIG. 19, the second harmonic laser light which has passed through the beam splitter 14A is reflected by the mirror 21, and the light reflected by the mirror 21 is incident on the objective lens 22. The objective lens 22 condenses the incident second harmonic laser light so that the laser light forms a spot on the disk 27. The second harmonic laser light reflected by the disk 27 passes through the objective lens 22 and is reflected by the mirror 21 to be incident on the beam splitter 14A. The return second harmonic laser light is then reflected by the beam splitter 14A to be incident on the focusing lens 20. The focusing lens 20 condenses the return second harmonic laser light to be input into a third optical detector 28.

The third optical detector 28 is composed of a plurality of detection elements for generating an error signal for servo operation of the optical disk, which will be described later. The third optical detector 28 is preferably divided into four detection elements, and allows for the detection of a focusing error by a known astigmatism method or the like based on the outputs of the four detection elements, as well as the detection of a tracking error by a known push-pull method or the like. The third optical detector 28 also obtain a reproduction signal by reproducing information recorded on the disk based on the sum of the outputs of the detection elements.

The optical disk device with the above configuration performs the SHG laser stabilizing control when the disk mounted on a spindle motor (not shown) is rotated at the actuation of the device.

In the state where the SHG laser 3 can provide a stable and desired output, a focusing error signal indicating the state of the second harmonic laser light condensed on the disk 27 is generated based on the output of the third optical detector 28. Based on the focusing error signal, the lens holder 23 and the objective lens 22 are moved in a direction substantially vertical with respect to the disk 27 by a focusing actuator essentially composed of the coils 26a and 26b, the plate springs 25a and 25b, and the permanent magnets 24a and 24b, to control the state of the second harmonic laser light condensed on the disk 27. This is called focusing servo operation.

After the focusing servo operation, a tracking error signal indicating the positional displacement of the spot of the second harmonic laser light with respect to the track on the disk 27 is generated based on the output of the third optical detector 28. Based on the tracking error signal, the second harmonic laser light is controlled to trace the track on the disk 27. This is called tracking servo operation.

After the focusing servo operation and the tracking servo operation are performed, information recorded on the disk 27 can be reproduced based on the sum of the output signals of the detection elements of the third optical detector 28.

After the wavelength-changeable current control is performed and the output of the SHG laser 3 is stabilized, the intensity of the second harmonic laser light from the SHG laser 3 is appropriately changed by adjusting the power-changeable current to be applied to the active region 1-1 of the semiconductor laser 1. Thus, the intensity of the second harmonic laser light required for recording information on the disk 27, the intensity of the second harmonic laser light required for deleting information on the disk 27, and the intensity of the second harmonic laser light required for reproducing information from the disk 27 can be selectively set.

Thus, in the optical disk recording/reproduction device using the SHG laser stabilizing control device of Example 5, the surface recording density of the optical disk can be improved, and stable recording/reproduction characteristics can be obtained.

In the above examples, the mode boundary is defined as the instance at which the intensity of the output light of the SHG laser which is being monitored changes in a step-wise manner. Alternatively, the mode boundary may be defined as the instance at which the wavelength of the SHG laser changes in a step-wise manner, and the intensity and the change amount of the output light of the SHG laser at this instance may be obtained.

As described above, according to the SHG laser stabilizing device of the present invention, the wavelength-changeable current is automatically set in the range where the oscillation wavelength of the semiconductor laser does not mode-hop, thereby to stabilize the second harmonic power of the SHG output.

Even when a plurality of maximal values exist in the second harmonic power of the output light of the SHG laser, the maximum second harmonic power is precisely recognized, and the temperature of the SHG laser corresponding to the maximum second harmonic power can be determined.

The temperature control of the SHG laser can be performed precisely and swiftly.

The output characteristics of the semiconductor laser can be kept constant, while the current applied to the active region of the semiconductor laser is controlled by constant voltage driving.

In the optical disk recording/reproduction device according to the present invention which uses the SHG laser stabilizing control device described above, the surface recording density of the optical disk improves and stable recording/reproduction characteristics can be obtained.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An SHG laser stabilizing control device comprising:
   an SHG laser including a semiconductor laser having a wavelength which changes in a step-wise manner in response to a change in a wavelength-changeable current and a wavelength conversion element which converts the wavelength of output light of the semiconductor laser into a shorter wavelength;
   an optical detection section for detecting a step-wise change in the wavelength of output light of the SHG laser;
   a current changing section which changes the wavelength-changeable current supplied to the semiconductor laser in order to change the wavelength of the semiconductor laser; and
   a wavelength-changeable current control section which obtains a gap current value of the wavelength-changeable current at which the step-wise change in the wavelength is detected by the optical detection section and adds or subtracts a predetermined current value to or from the gap current value to set a wavelength-changeable current value.

2. An SHG laser stabilizing control device according to claim 1, wherein the optical detection section detects an intensity of the output light of the SHG laser.

3. An SHG laser stabilizing control device according to claim 2, wherein the wavelength-changeable current control section gradually increases or decreases the wavelength-changeable current by controlling the current changing section, to obtain a gap current value of the wavelength-changeable current at which the step-wise change in the output of the optical detection section is maximum, and adds or subtracts a predetermined current value to or from the gap current value to set the wavelength-changeable current value.

4. An SHG laser stabilizing control device according to claim 2, wherein the wavelength-changeable current control section gradually increases or decreases the wavelength-changeable current by controlling the current changing section, to obtain a first gap current value and a second gap current value which is next adjacent to the first gap current value of the wavelength-changeable current at which the detected SHG laser output has changed in a step-wise manner, and obtains a predetermined current value to be added to or subtracted from the gap current values based on a difference current between the first and second current values.

5. An SHG laser stabilizing control device according to claim 2, wherein the wavelength-changeable current control section gradually increases or decreases the wavelength-changeable current by controlling the current changing section, to obtain a first gap current value and a second gap current value which is next adjacent to the first gap current value of the wavelength-changeable current at which the detected intensity of the output light of the SHG laser has changed in a step-wise manner, and obtains 20% to 80% of a difference current between the first and second current values as a predetermined current value to be added to or subtracted from the gap current values.

6. An SHG laser stabilizing control device according to claim 2, wherein the wavelength-changeable current control section changes the wavelength-changeable current by controlling the current changing section, to obtain a wavelength-changeable current $I_{LDpmax}$ at which the output of the optical detection section is maximum, and gradually increases the wavelength-changeable current to obtain a gap current value $I_{LDspmax}$ corresponding to a wavelength-changeable current at which the step-wise change in the output of the optical detection section is maximum, to add a predetermined current value to the gap current value $I_{LDspmax}$ if the gap current value $I_{LDspmax}$ is equal to or less than the maximum wavelength-changeable current $I_{LDpmax}$, or subtract the predetermined current value from the gap current value $I_{LDspmax}$ if the gap current value $I_{LDspmax}$ exceeds the maximum wavelength-changeable current $I_{LDpmax}$.

7. An SHG laser stabilizing control device according to claim 2, wherein the wavelength-changeable current control section changes the wavelength-changeable current by controlling the current changing section, to obtain a wavelength-changeable current $I_{LDpmax}$ at which the output of the optical detection section is maximum, and gradually decreases the wavelength-changeable current to obtain a gap current value $I_{LDspmax}$ corresponding to a wavelength-changeable current at which the step-wise change in the output of the optical detection section is maximum, to subtract a predetermined current value from the gap current value $I_{LDspmax}$ if the gap current value $I_{LDspmax}$ is equal to or less than the maximum wavelength-changeable current $I_{LDpmax}$, or add the predetermined current value to the gap current value $I_{LDspmax}$ if the gap current value $I_{LDspmax}$ exceeds the maximum wavelength-changeable current $I_{LDpmax}$.

8. An SHG laser stabilizing control device according to claim 2, wherein the wavelength-changeable current control section gradually increases or decreases the wavelength-changeable current by controlling the current changing section, to obtain a gap current value $I_{LDspmax}$ of the wavelength-changeable current at which the step-wise change in the output of the optical detection section is maximum, and further gradually increases or decreases the wavelength-changeable current to obtain a gap current value of the wavelength-changeable current at which the output of the optical detection section has changed in a step-wise manner, to obtain a difference current between these gap current values and add or subtract a predetermined current value which is smaller than the difference current to or from the gap current value $I_{LDspmax}$ thereby to set a wavelength-changeable current value.

9. An SHG laser stabilizing control device according to claim 2, wherein the wavelength-changeable current control section gradually increases or decreases the wavelength-changeable current by controlling the current changing section, to obtain a gap current value $I_{LDspmax}$ of the wavelength-changeable current at which the step-wise change in the output of the optical detection section is maximum, and further gradually increases or decreases the wavelength-changeable current to obtain a gap current value of the wavelength-changeable current at which the output of the optical detection section has changed in a step-wise manner, so as to obtain a difference current between these gap current values and add or subtract a predetermined current value which is 20% to 80% of the difference current to or from the gap current value $I_{LDspmax}$ thereby to set a wavelength-changeable current value.

10. An SHG laser stabilizing control device according to claim 2, wherein the SHG laser has a configuration where the semiconductor laser and the wavelength conversion element are integrally formed on a same base material.

11. An SHG laser stabilizing control device according to claim 2, further comprising:
   a temperature changing section for changing a temperature of the SHG laser;
   a temperature detection section for detecting the temperature of the SHG laser; and a temperature control section for controlling the temperature changing section based on an output of the temperature detection section so that the temperature of the SHG laser is a predetermined temperature.

12. An SHG laser stabilizing control device according to claim 2, wherein the wavelength-changeable current which changes the wavelength of the semiconductor laser is controlled under a state where a power-changeable current which changes the intensity of the output light of the semiconductor laser is controlled to be constant.

13. An SHG laser stabilizing control device according to claim 2, further comprising an infrared-cut filter for cutting infrared light of the output light of the SHG laser, wherein the output light of the SHG laser is detected via the infrared-cut filter.

14. An SHG laser stabilizing control device comprising:

an SHG laser including a semiconductor laser having a wavelength which changes in a step-wise manner in response to a change in a wavelength-changeable current and a wavelength conversion element which converts the wavelength of output light of the semiconductor laser into a shorter wavelength;

an optical detection section for detecting an intensity of output light of the SHG laser;

a current changing section which changes the wavelength-changeable current supplied to the semiconductor laser in order to change the wavelength of the semiconductor laser; and a wavelength-changeable current control section which changes the wavelength-changeable current by controlling the current changing section to obtain a maximum output of the optical detection section, gradually increases the wavelength-changeable current to obtain an output $P_{th1}$ of the optical detection section at which the output has exceeded a first threshold value which is smaller than the maximum output by a predetermined value, and gradually increases the wavelength-changeable current to obtain a wavelength-changeable current at which the output of the optical detection section has exceeded a second threshold value which is smaller than $P_{th1}$ by a predetermined value, to add a predetermined current value to the obtained wavelength-changeable current to set a wavelength-changeable current value.

15. An SHG laser stabilizing control device according to claim 14, wherein the first threshold value is set at a value equal to or less than a maximum value in a range of the output of the optical detection section where the output continuously changes with the change of the wavelength-changeable current ranging from a wavelength-changeable current at which a step-wise change in the output of the optical detection section which is closest to the maximum output has occurred on the side below the wavelength-changeable current corresponding to the maximum output of the optical detection section to the wavelength-changeable current corresponding to the maximum output.

16. An SHG laser stabilizing control device according to claim 14, wherein the second threshold value is set between a larger value and a smaller value of an output of the optical detection section at a point of the step-wise change in the output of the optical detection section which is closest to the maximum output on the side below the wavelength-changeable current corresponding to the maximum output of the optical detection section.

17. An SHG laser stabilizing control device comprising:

an SHG laser including a semiconductor laser having a wavelength which changes in a step-wise manner in response to a change in a wavelength-changeable current and a wavelength conversion element which converts the wavelength of output light of the semiconductor laser into a shorter wavelength;

an optical detection section for detecting an intensity of output light of the SHG laser;

a current changing section which changes the wavelength-changeable current supplied to the semiconductor laser in order to change the wavelength of the semiconductor laser; and a wavelength-changeable current control section which changes the wavelength-changeable current by controlling the current changing section to obtain a maximum output of the optical detection section, gradually decreases the wavelength-changeable current to obtain an output $P_{th1}$ of the optical detection section at which the output has exceeded a first threshold value which is smaller than the maximum output by a predetermined value, and gradually decreases the wavelength-changeable current to obtain a wavelength-changeable current at which the output of the optical detection section has exceeded a second threshold value which is smaller than $P_{th1}$ by a predetermined value, to subtract a predetermined current value from the obtained wavelength-changeable current to set a wavelength-changeable current value.

18. An SHG laser stabilizing control device according to claim 17, wherein the first threshold value is set at a value equal to or less than a maximum value in a range of the output of the optical detection section where the output continuously changes with the change of the wavelength-changeable current ranging from a wavelength-changeable current at which a step-wise change in the output of the optical detection section which is closest to the maximum output has occurred to the wavelength-changeable current corresponding to the maximum output.

19. An SHG laser stabilizing control device according to claim 17, wherein the second threshold value is set between a larger value and a smaller value of an output of the optical detection section at a point of the step-wise change of the output of the optical detection section which is closest to the maximum output on the side above the wavelength-changeable current corresponding to the maximum output of the optical detection section.

20. An SHG laser stabilizing control device comprising:

an SHG laser including a semiconductor laser having a wavelength which changes in a step-wise manner in response to a change in a wavelength-changeable current and a wavelength conversion element which converts the wavelength of output light of the semiconductor laser into a shorter wavelength;

an optical detection section for detecting an intensity of output light of the SHG laser;

a current changing section which changes the wavelength-changeable current supplied to the semiconductor laser in order to change the wavelength of the semiconductor laser;

a wavelength-changeable current control section which changes the wavelength-changeable current by the current changing section to obtain a gap current value of the wavelength-changeable current at which an output of the optical detection section changes in a step-wise manner, and adds or subtracts a predetermined current value to or from the gap current value to set a wavelength-changeable current value;

a temperature changing section for changing a temperature of the SHG laser;

a temperature detection section for detecting the temperature of the SHG laser; and a temperature control section for controlling the temperature changing section based on an output of the temperature detection section so that the temperature of the SHG laser is a predetermined temperature, and in this state, controlling the temperature changing section so that the output of the optical detection section is a predetermined value after the wavelength-changeable current is set at the predetermined current value.

21. An SHG laser stabilizing control device according to claim 20, wherein the temperature control section controls the temperature changing section based on the output of the temperature detection section so that the temperature of the SHG laser is a predetermined temperature, and, in this state, operates by changing the temperature of the SHG laser in a predetermined range by the temperature changing section after the wavelength-changeable current is set at the predetermined current value to obtain a temperature at which the output of the optical detection section is a predetermined value, and then changing the temperature again along a predetermined change width having the obtained temperature at the center so that the output of the optical detection section has a predetermined value.

22. An SHG laser stabilizing control device according to claim 20, wherein the temperature control section controls the temperature changing section based on the output of the temperature detection section so that the temperature of the SHG laser is a predetermined temperature, and, in this state, operates by changing the temperature of the SHG laser toward a temperature lower than a target lower-limit temperature by the temperature changing section after the wavelength-changeable current is set at a predetermined current value by the wavelength-changeable current control section, and, after the temperature of the SHG laser reaches the lower-limit temperature, changing the temperature of the SHG laser toward a temperature higher than a target upper-limit temperature to obtain a temperature at which the output of the optical detection section is a predetermined value while the temperature of the SHG laser is changing from the lower-limit temperature to the upper-limit temperature, and then changing the temperature of the SHG laser again along a predetermined change width having the obtained temperature at the center so that the output of the optical detection section has a predetermined value.

23. An SHG laser stabilizing control device comprising:
an SHG laser including a semiconductor laser having a wavelength which changes in a step-wise manner in response to a wavelength-changeable current and an intensity of output light changes in response to a power-changeable current, and a wavelength conversion element which converts the wavelength of output light of the semiconductor laser into a shorter wavelength;
a first optical detection section for detecting a harmonic light beam of output light of the SHG laser;
a second optical detection section for detecting a fundamental wave light beam of the output light of the SHG laser;
a current changing section which changes the wavelength-changeable current supplied to the semiconductor laser in order to change the wavelength of the semiconductor laser;
a wavelength-changeable current control section which changes the wavelength-changeable current by the current changing section to obtain a gap current value of the wavelength-changeable current at which an output of the first optical detection section changes in a step-wise manner, and adds or subtracts a predetermined current value to or from the gap current value to set a wavelength-changeable current value;

a power-changeable current control section which controls a power-changeable current so that an output of the second optical detection section is made constant at the wavelength-changeable current control, and controls the power-changeable current so that an output of the first optical detection section is made constant after the wavelength-changeable current control.

24. An SHG laser stabilizing control device comprising:
an SHG laser including a semiconductor laser having a wavelength which changes in a step-wise manner in response to a wavelength-changeable current and an intensity of output light changes in response to a power-changeable current, and a wavelength conversion element which converts the wavelength of output light of the semiconductor laser into a shorter wavelength;
a first optical detection section for detecting a harmonic light beam of the output light of the SHG laser;
a second optical detection section for detecting a fundamental wave light beam of the output light of the SHG laser;
a current changing section which changes the wavelength-changeable current supplied to the semiconductor laser in order to change the wavelength of the semiconductor laser;
a wavelength-changeable current control section which changes the wavelength-changeable current by the current changing section to obtain a gap current value of the wavelength-changeable current at which an output of the first optical detection section changes in a step-wise manner, and adds or subtracts a predetermined current value to or from the gap current value to set a wavelength-changeable current value;
a temperature changing section for changing a temperature of the SHG laser;
a temperature detection section for detecting the temperature of the SHG laser;
a temperature control section for controlling the temperature changing section based on an output of the temperature detection section so that the temperature of the SHG laser is a predetermined temperature, and, in this state, controlling the temperature changing section so that the output of the optical detection is a predetermined value after the wavelength-changeable current is set at the predetermined current value; and
a power-changeable current control section which controls the power-changeable current so that an output of the second optical detection section is made constant when the wavelength-changeable current control and the change of the temperature of the SHG laser change are being performed, and controls the power-changeable current so that an output of the first optical detection section is made constant when the wavelength-changeable current control and the change of the temperature of the SHG laser are not being performed.

25. An optical disk recording/reproduction device comprising:
an SHG laser stabilizing control device according to claim 1; and
an optical system for condensing output light of the SHG laser of the SHG laser stabilizing control device on an optical disk.

* * * * *